(12) United States Patent
Goel

(10) Patent No.: US 9,222,983 B2
(45) Date of Patent: Dec. 29, 2015

(54) CIRCUIT AND METHOD FOR MONOLITHIC STACKED INTEGRATED CIRCUIT TESTING

(71) Applicant: Taiwan Semiconductor Manufacturing Company, Ltd., Hsin-Chu (TW)

(72) Inventor: Sandeep Kumar Goel, Dublin, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 82 days.

(21) Appl. No.: 14/027,976

(22) Filed: Sep. 16, 2013

(65) Prior Publication Data

US 2015/0082108 A1 Mar. 19, 2015

(51) Int. Cl.
  *G01R 31/28* (2006.01)
  *G01R 31/3177* (2006.01)
  *G01R 31/3185* (2006.01)

(52) U.S. Cl.
  CPC *G01R 31/318558* (2013.01); *G01R 31/318513* (2013.01)

(58) Field of Classification Search
  CPC .......... H01L 2224/48227; H01L 2224/73265; H01L 2224/32145; H01L 2224/16145; H01L 24/32; H01L 24/48; H01L 21/8221; H01L 25/0657; H01L 2924/14; H01L 22/22; G01R 31/2896; G01R 31/31813; G01R 31/318536; G01R 31/3177

USPC .................................................. 714/726, 729
See application file for complete search history.

(56) References Cited

U.S. PATENT DOCUMENTS

| | | |
|---|---|---|
| 8,642,416 B2 * | 2/2014 | Or-Bach et al. ................ 438/199 |
| 8,669,778 B1 | 3/2014 | Or-Bach et al. |
| 2012/0193621 A1 | 8/2012 | Or-Bach et al. |
| 2012/0193681 A1 | 8/2012 | Or-Bach et al. |
| 2012/0193806 A1 | 8/2012 | Or-Bach et al. |
| 2013/0095580 A1 * | 4/2013 | Or-Bach et al. ................. 438/17 |
| 2015/0077147 A1 * | 3/2015 | Goel .......................... 324/750.3 |

OTHER PUBLICATIONS

Dean L. Lewis, "Design for Pre-bond Testability in 3D Integrated Circuits", School of Electrical and Computer Engineering, Dec. 15, 2012, 125 pages.

* cited by examiner

*Primary Examiner* — Phung M Chung
(74) *Attorney, Agent, or Firm* — Haynes and Boone, LLP

(57) ABSTRACT

A monolithic stacked integrated circuit (IC) is provided with a known-good-layer (KGL) test circuit and a scan segment in one of its layers. The test circuit includes a plurality of inputs, outputs, and multiplexers coupled to the scan segment and to a second layer of the IC. The test circuit further includes a plurality of control elements such that scan testing of the IC may be conducted on a layer-by-layer basis.

20 Claims, 22 Drawing Sheets

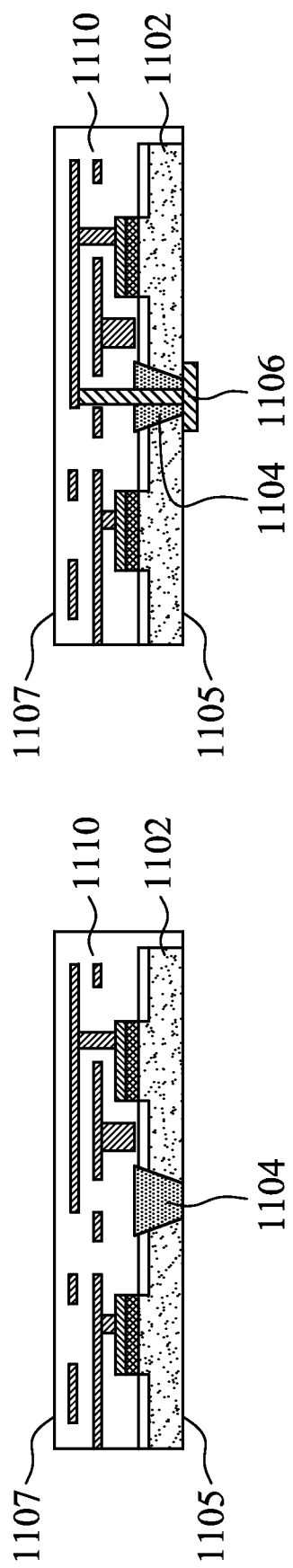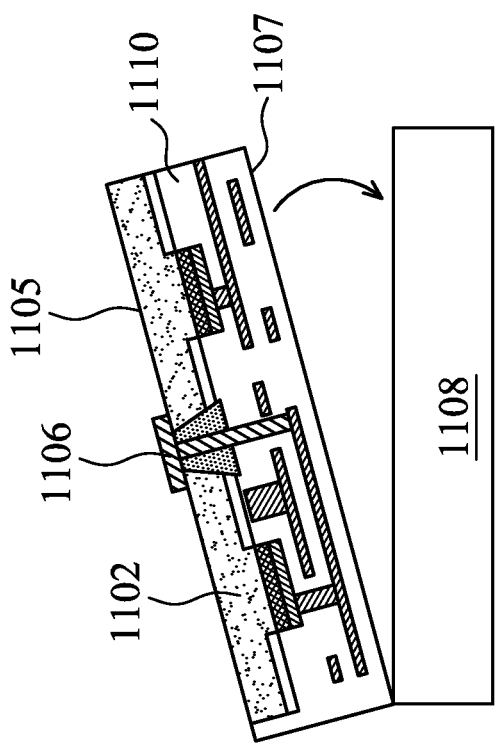
FIG. 11a  FIG. 11b  FIG. 11c

CIRCUIT AND METHOD FOR MONOLITHIC STACKED INTEGRATED CIRCUIT TESTING

BACKGROUND

Ongoing trends in semiconductor device technology include miniaturization of feature size of semiconductor devices as well as increasing functional complexity of semiconductor devices. Although a feature size reduction may facilitate an increase in the number of semiconductor building blocks per unit area of a semiconductor device, e.g. a die or an integrated circuit (IC), thus facilitating more complex functionality per device, many demands for the increased functional complexity cannot be met by a single device.

Recently, this has led to the development of aggregate devices such as three-dimensional integrated circuits (3D ICs). One example of creating a 3D IC is by building electronic components and their connections in layers on a single semiconductor wafer. As a base layer of the IC is formed on a substrate, a first upper layer is formed over the base layer and is connected to the base layer using vias. Another upper layer may be formed over the first upper layer, and so on. In this way, the IC is sequentially grown layer by layer. An IC thus built is generally known as a monolithic stacked IC.

Though promising in providing density and performance benefits in advanced process nodes, such as 28 nm and below, the method of creating monolithic stacked ICs aforementioned has its own challenges. One of the challenges is directed to manufacture fault testing of monolithic stacked ICs. Conventional IC manufacture fault testing employs a known-good-die (KGD) concept where a pre-fabricated die is tested with a suite of test patterns such as supply open/short test, ground open/short test, stuck-at fault test, current consumption tests (e.g., IDDQ), timing path delay fault (or transition fault) test, etc. If a die is found with defects, it is removed from further processing, such as packaging, to save cost. The manufacture fault testing is typically enabled by some structured test architecture, such as SCAN test architecture. This KGD concept has been found less desirable in monolithic stacked IC manufacture fault testing. This is primarily due to the fact that complete logic generally spans over multiple layers in a monolithic stacked IC and complete fault testing with quality similar to or higher than KGD testing cannot be applied until all or multiple layers are built. Yet, waiting until all or multiple layers are built before applying fault testing presents a significant yield loss issue. In addition, testing of each layer during manufacturing of monolithic stacked ICs enables defect isolation and yield tracking per layer, which can be really helpful in finding layer manufacturing processing related issues.

Accordingly, an enhancement in monolithic stacked IC manufacture fault testing is needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 11a-11i shows an embodiment of monolithic stacked IC manufacture fault testing according to various aspects of the present disclosure.

DETAILED DESCRIPTION

Figure 1:
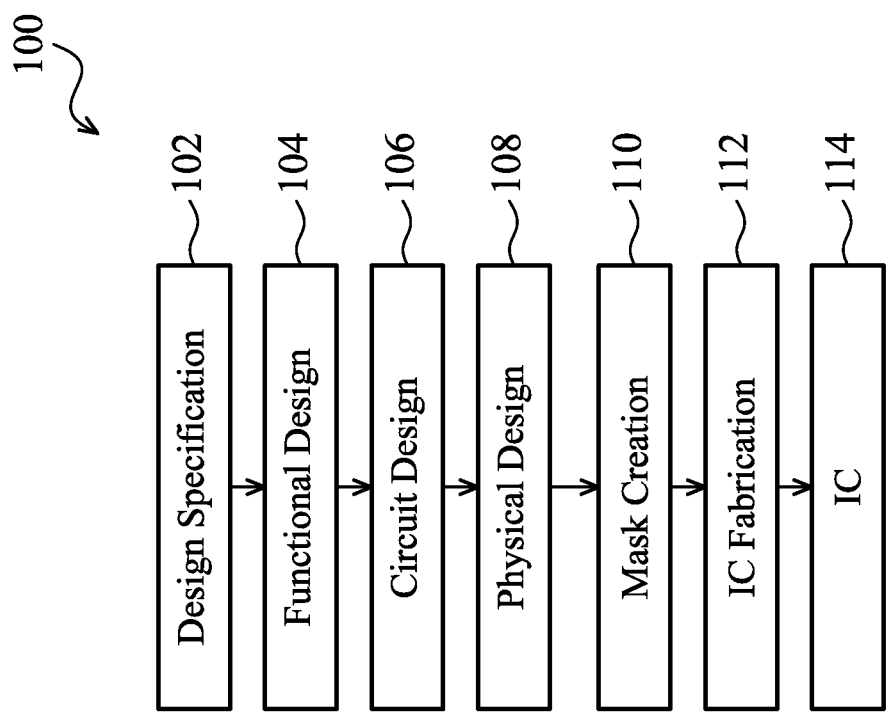
FIG. 1 is a simplified block diagram of an embodiment of an integrated circuit (IC) design and manufacturing flow.

The following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure relates generally to fault testing of semiconductor devices, and more particularly, to a layer-bylayer and/or multiple layers fault testing when fabricating monolithic stacked integrated circuits. However, specific embodiments are provided as examples to teach the broader inventive concept, and one of ordinary skill in the art can easily apply the teaching of the present disclosure to other methods or apparatus.

FIG. 1 is a simplified block diagram of an embodiment of an integrated circuit (IC) design and manufacturing flow 100 to produce an IC 114. In the present embodiment, the IC 114 is a monolithic stacked IC that includes a base layer and one or more upper layers. The IC design flow 100 typically starts with a design specification 102 which includes the design requirements of the IC 114. It then proceeds to functional design 104 where the design of the IC 114 is partitioned into a plurality of layers and the plurality of layers interact to produce the desired embodiment.

The IC design flow 100 (FIG. 1) proceeds to circuit design 106. In an embodiment, the IC design is described in Register Transfer Level (RTL) language such as Verilog or VHDL and then is synthesized into a netlist. In another embodiment, the IC design is described graphically in schematic. In an embodiment, the IC design includes not only circuits for the intended functionality of the IC 114, but also circuits for uncovering faults (or defects) during IC fabrication 112. This is commonly referred to as Design for Test (DFT) circuits. In general, the faults are the results of semiconductor manufacture process abnormalities, imperfections and process variations. For example, material may be formed where it should not be or material may be absent where it should be. The faults can be modeled at various levels of design abstraction. Two commonly used fault models are stuck-at-0 (SA0) and stuck-at-1 (SA1) fault models. During fault testing, a fault is detected when a particular test pattern activates or sensitizes the IC 114 to the fault and makes the error observable.

Structured fault testing architecture and automatic test pattern generation (ATPG) are frequently used in DFT. For example, basic scan architecture for an IC typically includes a scan enable input, a scan clock input, and a plurality of scan chains. Each scan chain includes a scan input, a scan output and a plurality of scan flip-flops of the IC in between the scan input and the scan output. The scan enable input controls the IC into one of two test modes: a shift test mode and a capture test mode. In the shift test mode, the plurality of flip-flops in each scan chain forms a chain of serial shift registers. Test pattern data is serially shifted into the scan chain through the scan input at a pace controlled by the scan clock input. At the same time, data in the scan chain is shifted out of and observed at the scan output. In the capture test mode, the plurality of scan flip-flops in each scan chain assumes their respective role in functional mode (non-test mode). When one or more clock signals are applied at the scan clock input, the plurality of scan flip-flops captures results of the test. A subsequent shift operation shifts the results out of the scan output and compares the results with predetermined targets to detect whether faults are present in the IC. Various enhancements may be added to the basic scan architecture described above. In an embodiment, test compression logic is added to include more than one scan chains in between one scan input and one scan output thereby to improve test efficiency.

The scan architecture aforementioned works well with a pre-fabricated die, but not with a monolithic stacked IC where complete logic of the IC is not present until all layers of the IC are fabricated. In practice, it is desirable to detect faults on each layer of a monolithic stacked IC is fabricated. For example, if one layer of a monolithic stacked IC is found defective, the IC can be removed from further manufacturing process thereby to save processing and/or manufacturing cost. If removing of the IC is not possible or is not cost-effective, the particular IC/die location can be marked defective and no further testing is performed on that location in future processing and testing steps. This results in test cost savings. This layer-by-layer testing in a monolithic stacked IC fabrication is called known-good-layer (KGL) testing in the present disclosure. Various embodiments of the present disclosure are related to KGL testing and will be described in more details below.

The IC design flow 100 (FIG. 1) proceeds to physical design 108 where an IC design layout is produced. The IC design layout includes various geometrical patterns designed for the IC 114. The geometrical patterns correspond to patterns of metal, oxide, or semiconductor material layers that make up the various components of the IC device 114 to be fabricated. The various material layers combine to form various IC features in each layer of the IC 114.

With the IC design layout, the IC design flow 100 (FIG. 1) proceeds to mask creation 110 to produce one or more masks to be used for fabricating the various layers of the IC product according to the IC design layout. The mask creation 110 includes various tasks such as mask data preparation, where the IC design layout is translated into a form that can be physically written by a mask writer, and mask fabrication, where the design layout prepared by the mask data preparation is modified to comply with a particular mask writer and/or mask manufacturer and is then fabricated.

After the mask (or masks) has been fabricated, the IC design flow 100 (FIG. 1) proceeds to IC fabrication 112. The IC fabrication may be done by a myriad of manufacturing facilities. For example, there may be a manufacturing facility for the front end fabrication of a plurality of IC products (i.e., front-end-of-line (FEOL) fabrication), while a second manufacturing facility may provide the back end fabrication for the interconnection and packaging of the IC products (i.e., back-end-of-line (BEOL) fabrication), and a third manufacturing facility may provide other services for the foundry business.

In an embodiment, a semiconductor wafer is fabricated using the mask (or masks) to form the IC device 114. The semiconductor wafer includes a silicon substrate or other proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer may further include various doped regions, dielectric features, and multilevel interconnects (formed at subsequent manufacturing steps). In the present embodiment, the IC device 114 includes a base layer formed over a substrate and a plurality of upper layers formed over the base layer. The base layer and the plurality of upper layers may be inter-connected using through-layer vias (TLV). As each layer of the IC 114 is fabricated, a KGL testing according to various aspects of the present disclosure is performed to detect faults on the IC 114.

After being fabricated and tested fault free, the IC devices typically go through a packaging and further testing process before being delivered to market.

Figure 2:
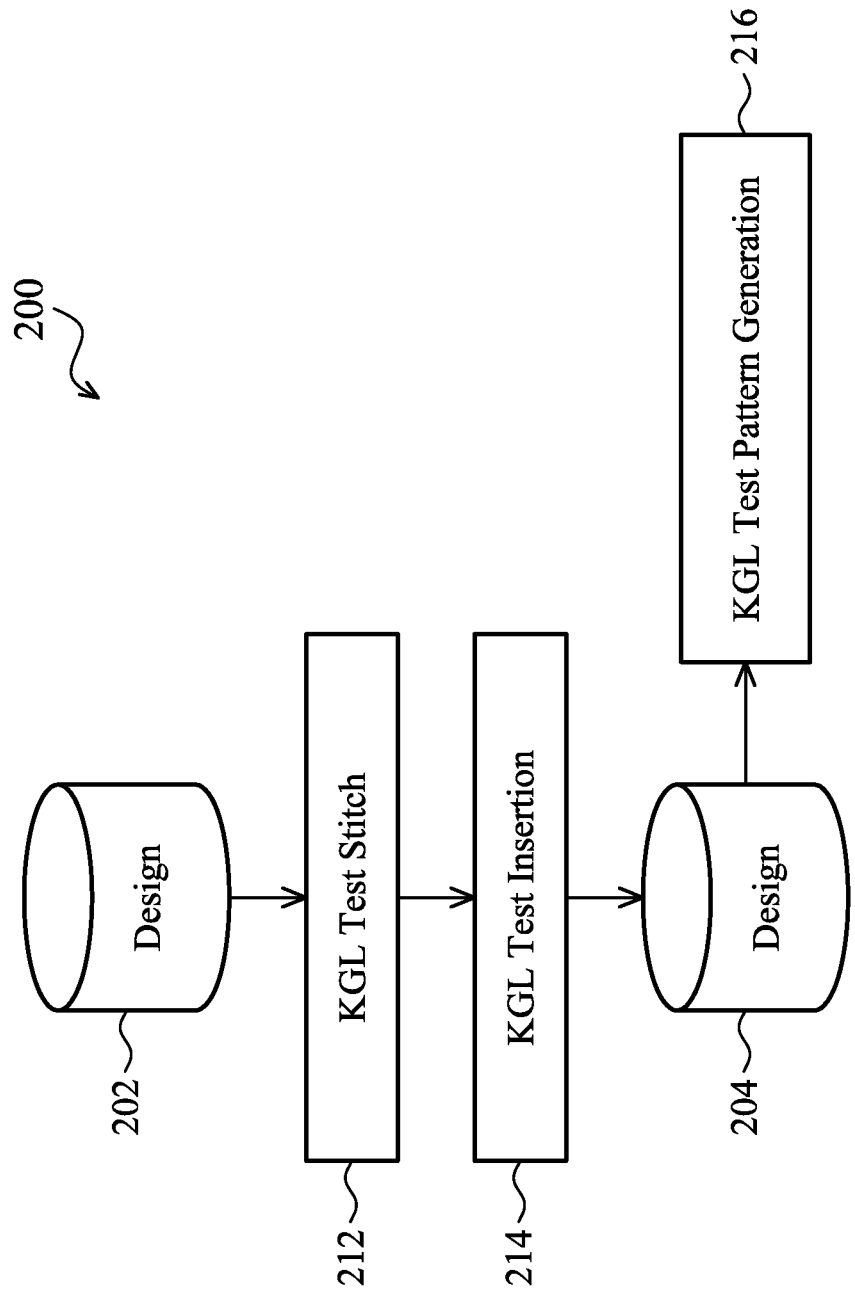
FIG. 2 is an embodiment of a part of the IC circuit design phase shown in FIG. 1 according to various aspects of the present disclosure.

FIG. 2 illustrates an embodiment of a method 200 of KGL test insertion and test pattern generation as part of the circuit design 106 (FIG. 1) according to various aspects of the present disclosure. The KGL test method 200 receives a design 202 where the circuits of the IC 114 have been partitioned into a base layer and a plurality of upper layers with each layer having scan flip-flops and/or other circuit components suitable for scan testing.

Figure 3:
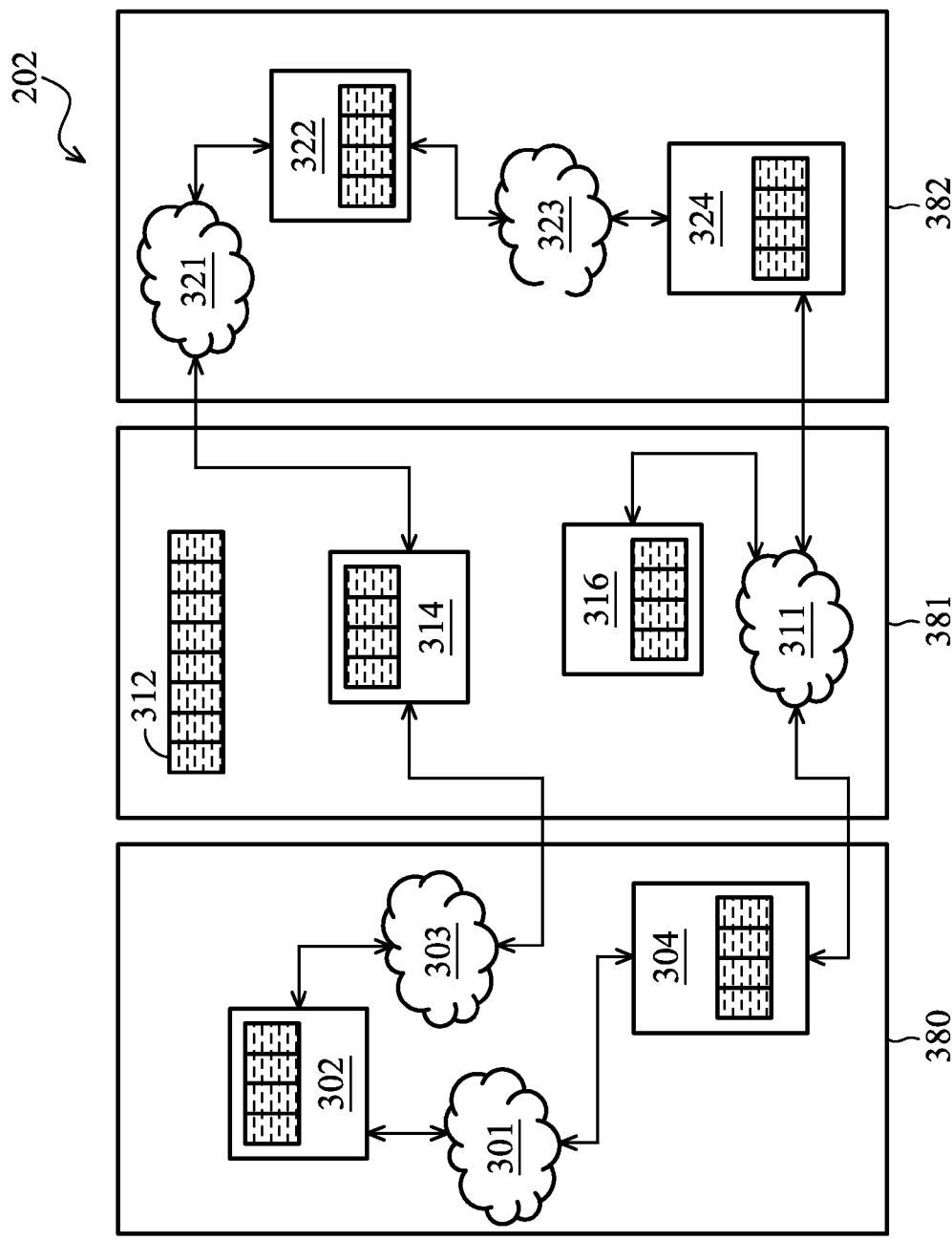
FIG. 3 illustrates a simplified graphical representation of an embodiment of a monolithic stacked IC design.

One example of the design 202 is shown in FIG. 3. As illustrated in FIG. 3, the design 202 includes a base layer 380, a first upper layer 381 and a second upper layer 382. The base layer 380 includes two pluralities of scan flip-flops, 302 and 304, and two logic clouds, 301 and 303. The first upper layer 381 includes three pluralities of scan flip-flops, 312, 314 and 316, and one logic cloud 311. The second upper layer 382 includes two pluralities of scan flip-flops, 322 and 324, and two logic clouds, 321 and 323. There may be interconnects between one layer and another layer. In an embodiment, some scan flip-flops in one layer may have already been stitched into one or more serial shift registers for scan test purposes which are called scan segments. For the following discussion, a pre-stitched scan segment is treated the same way as a scan flip-flop without limiting the present disclosure. In an embodiment, a scan flip-flop is register based. In an embodiment, a scan flip-flop is latch based.

Figure 4:
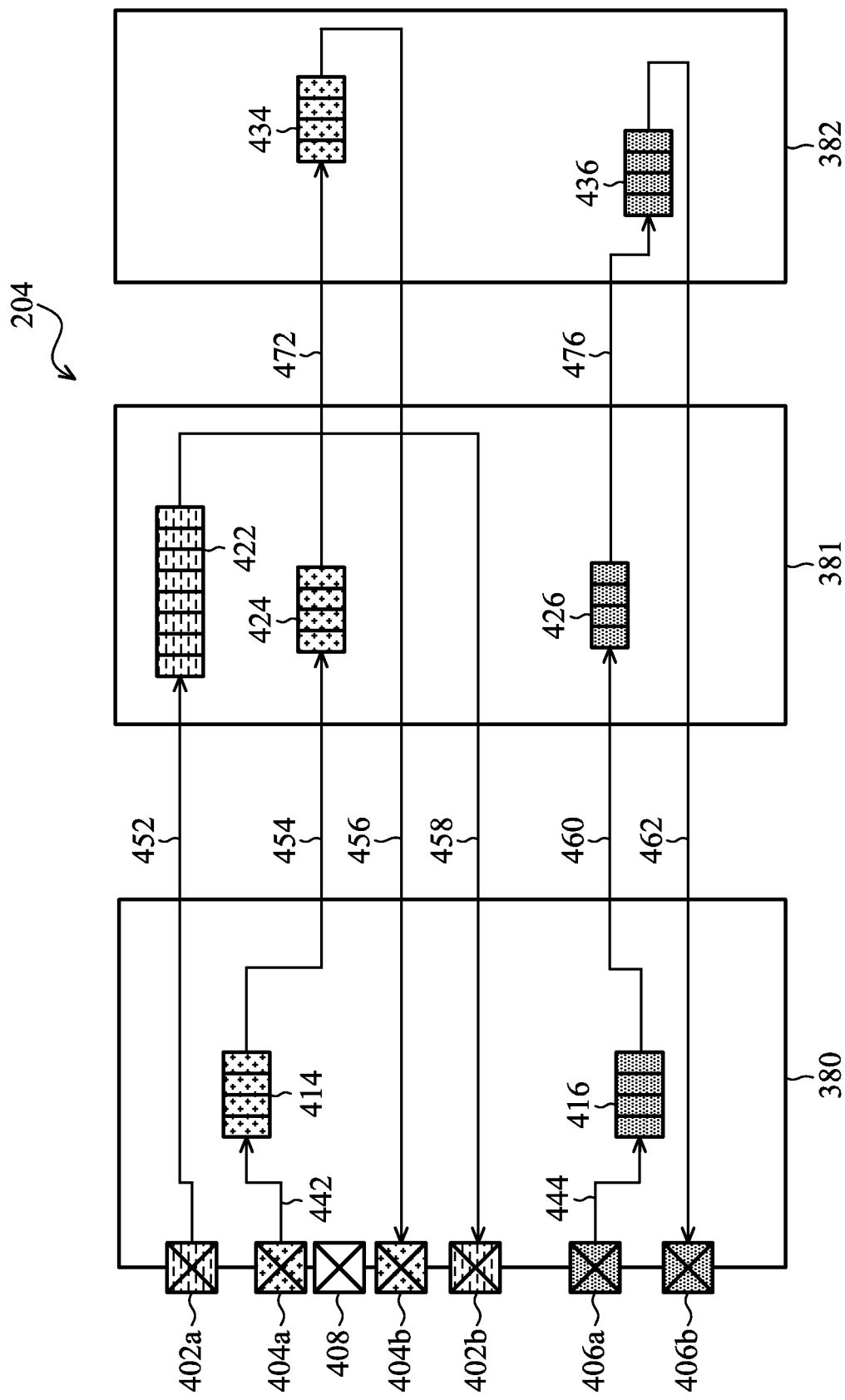
FIGS. 4 and 5 illustrate scan test architecture in a monolithic stacked IC design according to various aspects of the present disclosure.

The KGL test method 200 (FIG. 2) proceeds to operation 212 to create scan chains. Input/output (IO) pads for scan testing purposes are created and placed at the base layer 380. These include a plurality of scan inputs, a plurality of scan outputs, a scan enable signal and a scan clock signal. Scan flip-flops in design 202 are subsequently stitched into a plurality of scan chains. Referring to FIG. 4, for simplicity purposes, only scan chains are shown and the scan enable signal, scan clock signal, and various features of design 202 are omitted. However, those of ordinary skill in the art should appreciate that such omission does not limit the inventive scope of the present disclosure.

Referring again to FIG. 4, in the present embodiment, IO pads, 402a, 402b, 404a, 404b, 406a, 406b and 408, are included in the base layer 380. The input pad 408 is included for controlling various KGL test circuits according to various aspect of the present disclosure. Design 202 further includes three scan chains. A first scan chain includes a scan input 402a, a scan output 402b and a plurality of scan flip-flops 422. The scan input 402a is coupled to an input of the scan flip-flops 422 via node 452. An output of the scan flip-flops 422 is coupled to the scan output 402b via node 458. A second scan chain includes a scan input 404a, a scan output 404b and three pluralities of scan flip-flops, 414, 424 and 434. The scan input 404a is coupled to an input of the scan flip-flops 414 via node 442. An output of the scan flip-flops 414 is coupled to an input of the scan flip-flops 424 via node 454. An output of the scan flip-flops 424 is coupled to an input of the scan flip-flops 434 via node 472. An output of the scan flip-flips 434 is coupled to the scan output 404b via node 456. A third scan chain includes a scan input 406a, a scan output 406b and three pluralities of scan flip-flops, 416, 426 and 436. The scan input 406a is coupled to an input of the scan flip-flops 416 via node 444. An output of the scan flip-flops 416 is coupled to an input of the scan flip-flops 426 via node 460. An output of the scan flip-flops 426 is coupled to an input of the scan flip-flops 436 via node 476. An output of the scan flip-flops 436 is coupled to the scan output 406b via node 462. In following discussions, each scan chain is denoted by its scan input and scan output pair for simplicity purposes. For example, the first scan chain is denoted as 402a/402b. In an embodiment, the base layer 380 further includes scan enhancement circuits, such as test compression logic.

Further observations are made with reference to FIG. 4. The first scan chain, 402a/402b, spans across the base layer 380 and the first upper layer 381. The second and the third scan chains, 404a/404b and 406a/406b, span across the base layer 380, the first upper layer 381 and the second upper layer 382. Let $N_j$ be the number of scan chains of design 202 residing in or going through a layer j, where j=0 for the base layer 380, j=1 for the first upper layer 381, j=2 for the second upper layer 382, and so on. It holds true that $N_j >= N_{j+1}$ for all layers of the design 202. This relationship ensures that testing resources (number of scan pins) for any layer j is satisfied since all IO pads are located at the base layer k (k<=j) in the present disclosure.

Figure 5:
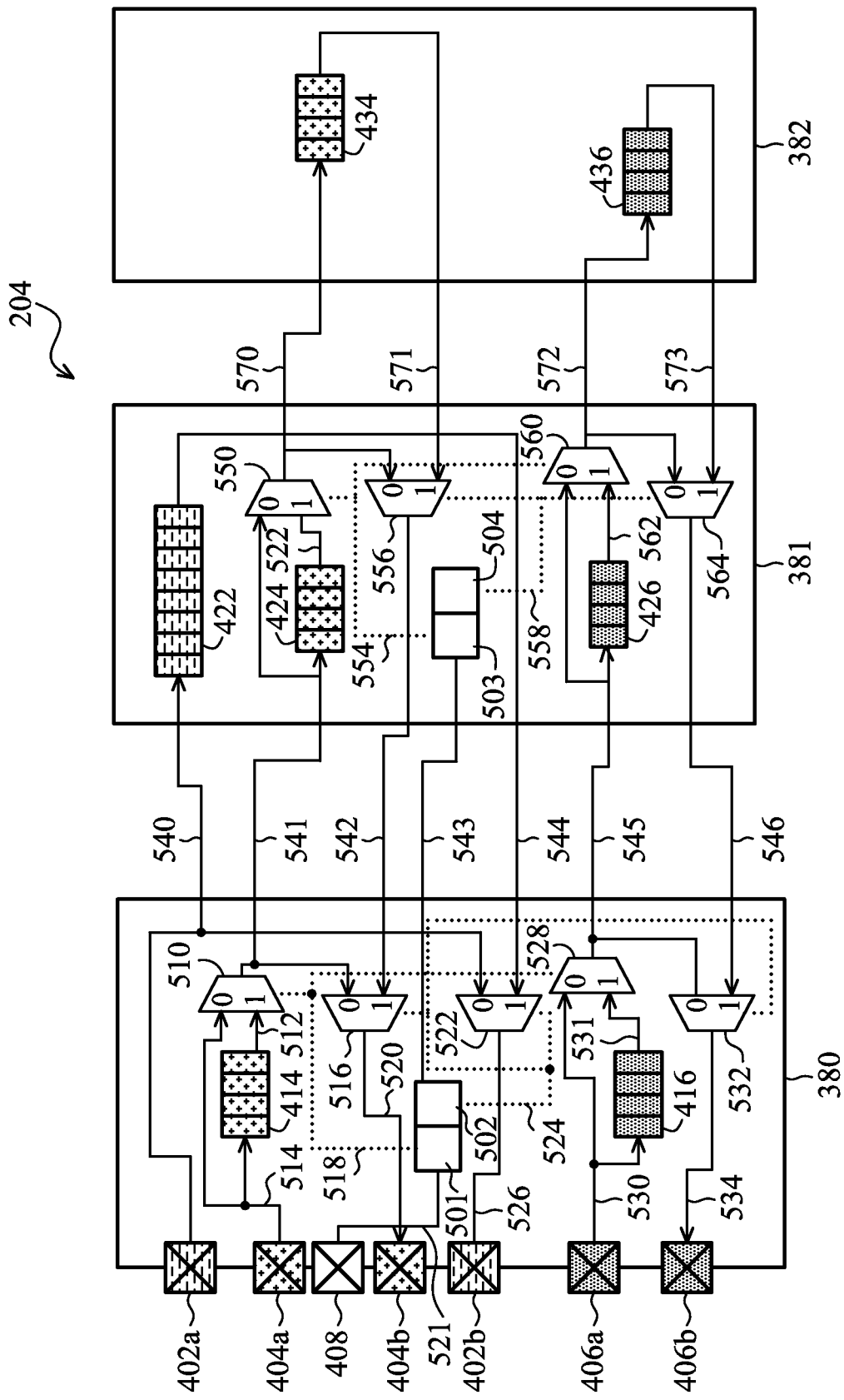

The KGL test method 200 (FIG. 2) proceeds to operation 214 where KGL test circuits are inserted into the design 202 thereby to produce a KGL test compliant design 204. Referring to FIG. 5, the KGL test circuits include a plurality of test control elements, 501, 502, 503 and 504, a plurality of multiplexers, 510, 516, 522, 528, 532, 550, 556, 560 and 564, and a plurality of nodes coupling the test control elements, the multiplexers and the scan chains. Various functions of the test control elements and the multiplexers are described in more details below.

There are at least two categories of multiplexers in the KGL test circuits: scan-in bypass multiplexers and scan-out bypass multiplexers. A scan-in bypass multiplexer has a function of passing scan shift data of a scan chain from an input of a layer directly to an output of the layer, thus bypassing scan flip-flops of the scan chain between the input and the output of the layer. Referring to FIG. 5, in the present embodiment, multiplexers 510, 528, 550 and 560 are scan-in bypass multiplexers. Taking multiplexer 510 as an example, scan input 404a is coupled to an input of scan flip-flops 414 and an input of multiplexer 510 via node 514. An output of scan flip-flops 414 is coupled to another input of multiplexer 510. An output of test control element 501 is coupled to a selection input of multiplexer 510. Thus, scan shift data from either scan input 404a or the output of scan flip-flops 414 may be passed to node 541 through multiplexer 510 depending on a value of test control element 501. The other scan-in bypass multiplexers may be analyzed similarly. A scan-out bypass multiplexer in a layer has a function of passing data to an output of the layer towards a scan output of a scan chain from either a higher layer output or an output of a scan-in bypass multiplexer of the scan chain in the layer. Referring again to FIG. 5, in the present embodiment, multiplexers 516, 522, 532, 556 and 564 are scan-out bypass multiplexers. Taking multiplexer 516 as an example, an input of multiplexer 516 is coupled to an output of layer 381 via node 542. Another input of multiplexer 516 is coupled to an output of scan-in bypass multiplexer 510 via node 541. A selection input of multiplexer 516 is coupled to test control element 502 via node 524. An output of multiplexer 516 is coupled to scan output 404b via node 520. Thus, either data from layer 381 or data from scan-in bypass multiplexer 510 may be passed to scan output 404b depending on a value of test control element 502. The other scan-out bypass multiplexers may be analyzed similarly. Further observations are made with reference to FIG. 5. In the present embodiment, there is a pair of a scan-in bypass multiplexer and a scan-out bypass multiplexer for each scan chain in each layer when the scan chain goes from the layer to another layer, with an exception of the scan chain 402a/402b at the base layer 380. That is because the base layer 380 does not include any scan flip-flop of the scan chain 402a/402b and a scan-in bypass multiplexer for the scan chain 402a/402b at the base layer 380 is degenerated into a wire and is merged into node 540.

Figure 6:
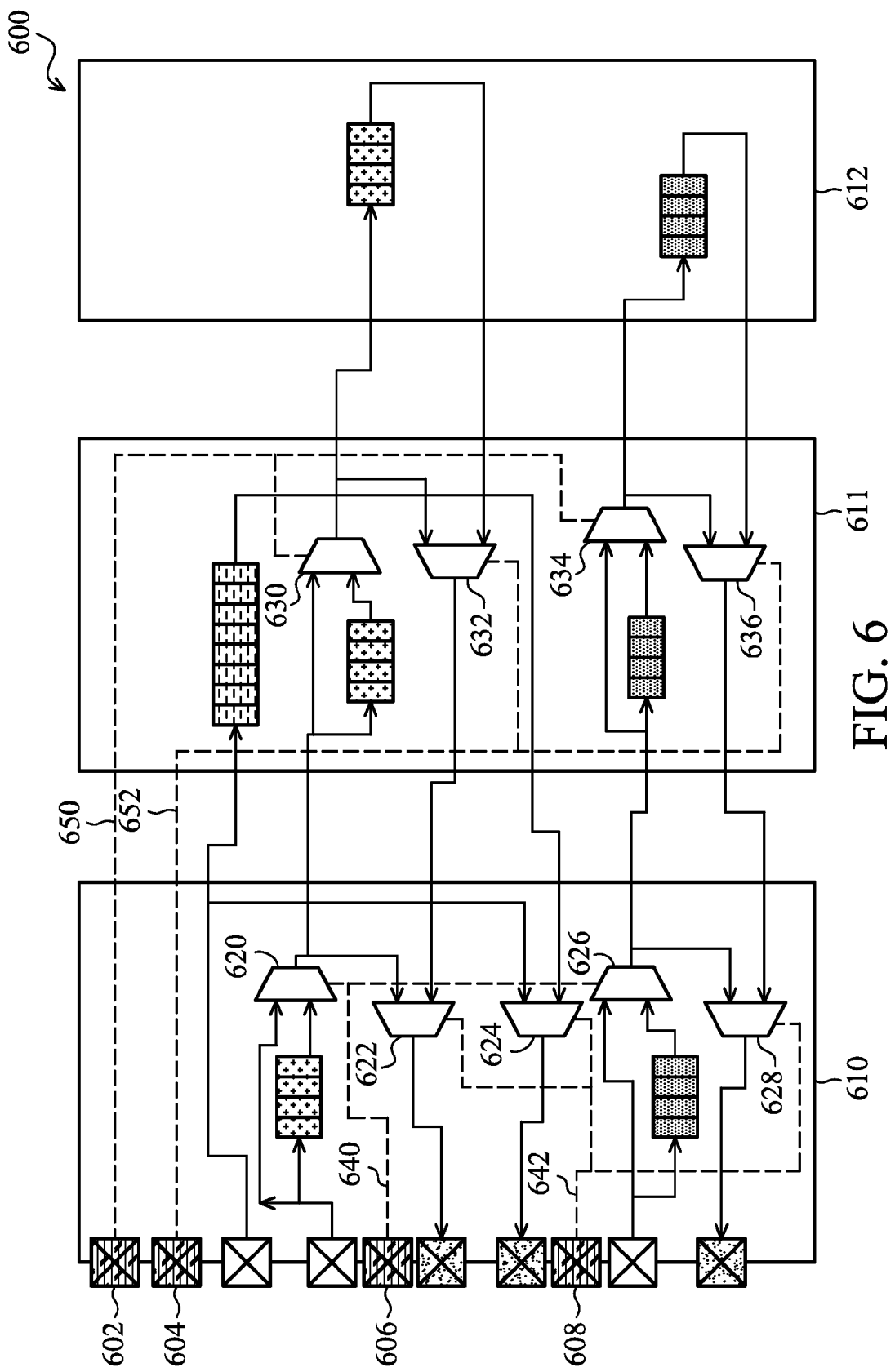
FIGS. 6 and 7 illustrate scan test architecture in a monolithic stacked IC design according to various aspects of the present disclosure.
Figure 7:
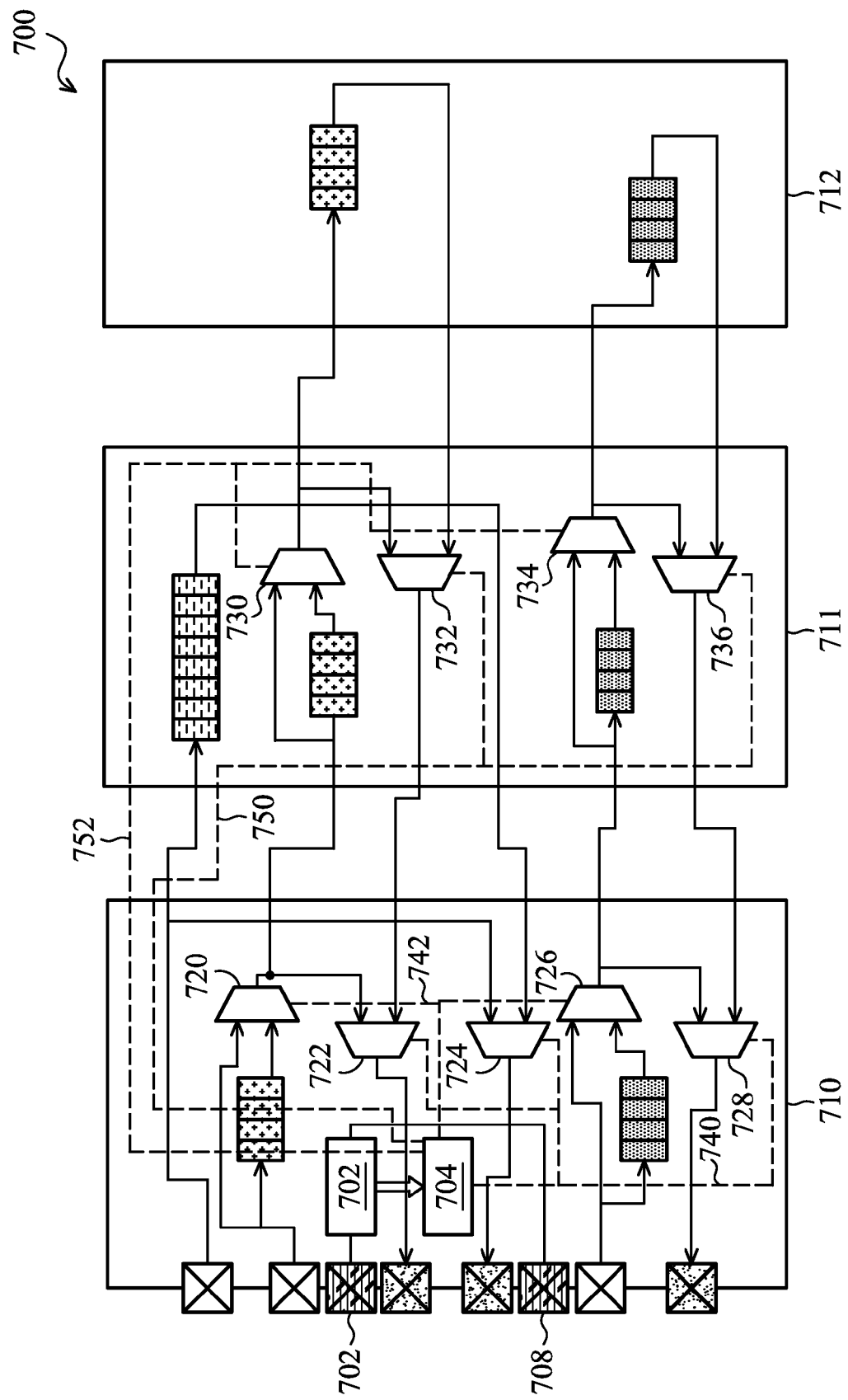

The test control elements, 501, 502, 503 and 504, set up the multiplexers such that scan testing of the IC 114 (design 204) may be conducted layer-by-layer and/or multiple layers together. This point will be illustrated in more details in a later section of the present disclosure. In addition, in the present embodiment as shown in FIG. 5, the test control elements, 501, 502, 503 and 504, are implemented as a chain of serial shift registers controlled through IO pad 408. In another embodiment, as shown in FIG. 6, test control elements 602, 604, 606 and 608, are implemented as IO pads at a base layer 610. In yet another embodiment, as shown in FIG. 7, test control elements 704 are implemented in a base layer 710 as storage elements, such as registers, programmed through a programmable interface 702, such as an IEEE1149.1 interface or an IEEE1500 interface. In another embodiment, an output of the test control element 504 may be fed back to the base layer 380 and may be connected to another IO Pad. This may be used for monitoring values of the test control elements 501-504.

Referring again to FIG. 2, although illustrated as separate operations in the present embodiment, operations 212 and 214 may be combined in another embodiment. Moreover, operations 212 and 214 may be performed in different orders and additional operation(s) may be performed before, after or between operations 212 and 214 in other embodiments.

After having produced the design 204, the KGL test method 200 (FIG. 2) proceeds to operation 216 where KGL test patterns are generated. The KGL test patterns are generated on a layer-by-layer basis which is illustrated in FIG. 8 in conjunction with FIGS. 9a-9e.

Figure 8:
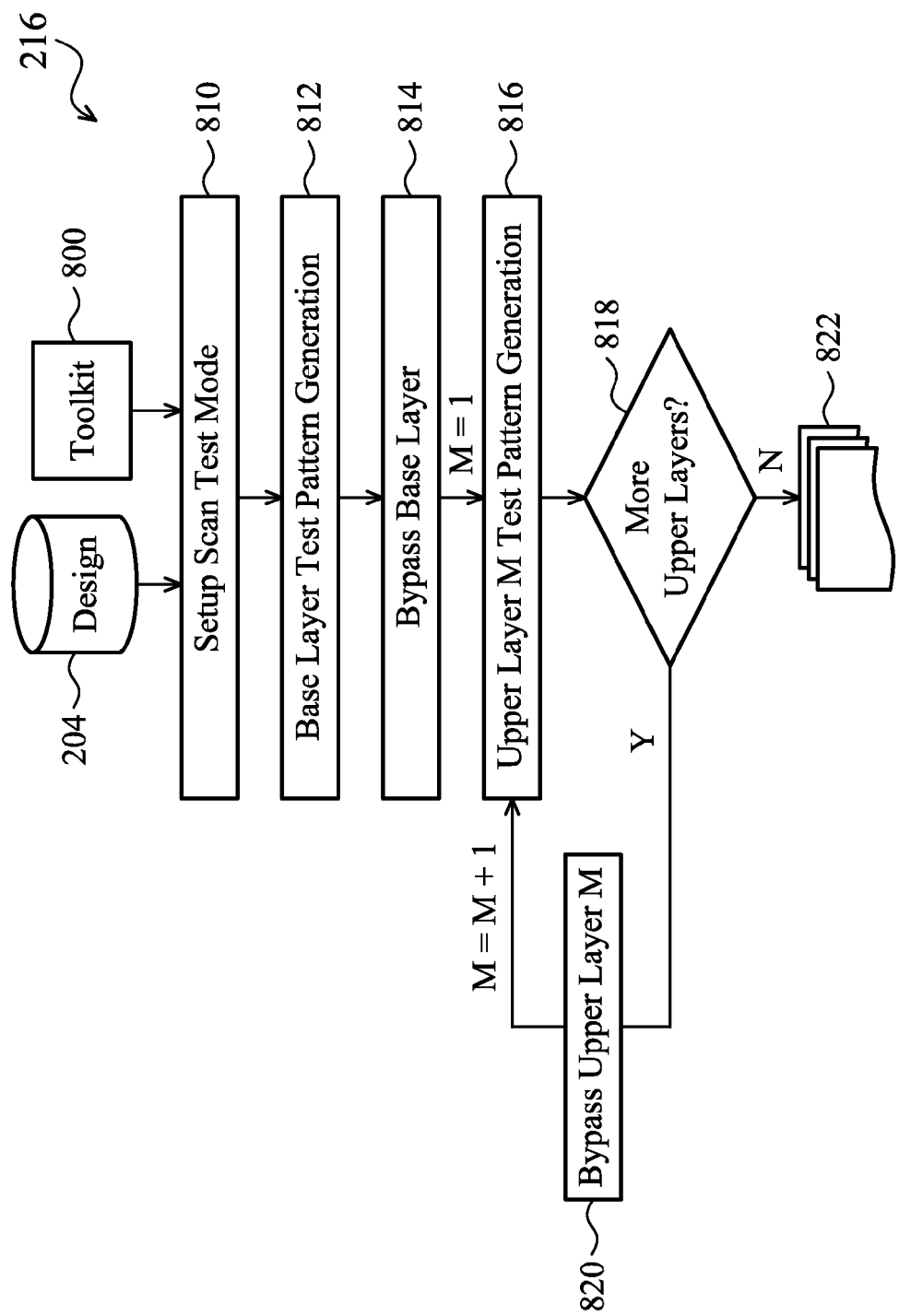
FIG. 8 illustrates a monolithic stacked IC test pattern generation flow according to various aspects of the present disclosure.

Referring to FIG. 8, an embodiment of KGL test pattern generation flow 216 begins with operation 810 where the design 204 is set into a test mode suitable for scan testing, so-called scan test mode. In an embodiment, operation 810 includes setting up the design 204 into scan test mode through input pads. In another embodiment, operation 810 includes setting up the design 204 into scan test mode through a programmable interface, such as an IEEE 1149.1 interface or an IEEE 1500 interface.

Figure 9A:
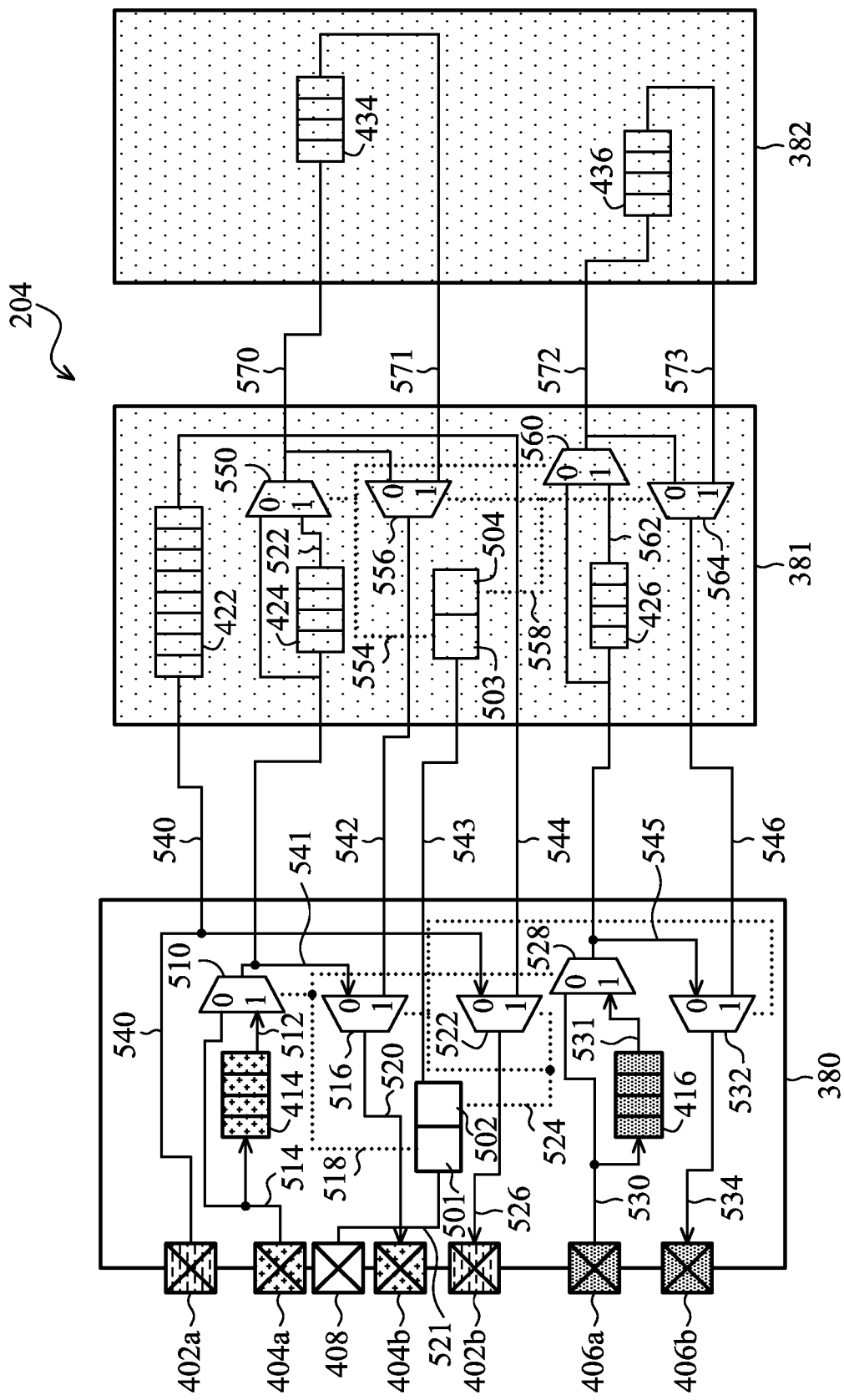
FIGS. 9a-9e illustrate monolithic stacked IC configurations during a layer-by-layer test pattern generation flow according to various aspects of the present disclosure.

The KGL test pattern generation flow 216 (FIG. 8) proceeds to operation 812 where test patterns for the base layer 380 are generated. Referring to FIG. 9a, the test control elements 501 and 502 are set to a value "1" and a value "0" respectively. With this configuration, scan shift data from a scan input only go through scan segments in the base layer 380 before returning back to a scan output.

Referring again to FIG. 9a, a scan shift operation for the scan chain 402a/402b is as follows: data goes from scan input 402a to an input of multiplexer 522 via node 540, then from an output of multiplexer 522 to scan output 402b via node 526.

Referring again to FIG. 9a, a scan shift operation for the scan chain 404a/404b is as follows: data goes from scan input 404a to an input of scan flip-flops 414 via node 514, from an output of scan flip-flops 414 to an input of multiplexer 510 via node 512, from an output of multiplexer 510 to an input of multiplexer 516 via node 541, then from an output of multiplexer 516 to scan output 404b via node 520.

Referring again to FIG. 9a, a scan shift operation for the scan chain 406a/406b is as follows: data goes from scan input 406a to an input of scan flip-flops 416 via node 530, from an output of scan flip-flops 416 to an input of multiplexer 528 via node 531, from an output of multiplexer 528 to an input of multiplexer 532 via node 545, then from an output of multiplexer 532 to scan output 406b via node 534.

The test patterns for detecting faults at the base layer 380 are generated by a toolkit 800, such as a commercially available ATPG tool. Layers 381 and 382 (FIG. 9a) are ignored during operation 812 (FIG. 8) because they may not even exist when the base layer 380 is being tested during fabrication of the IC device 114 (design 204). In an embodiment, input signals coming to the base layer 380 from upper layers are treated as unknowns in operation 812 and are not observed at the scan outputs 402b, 404b and 406b. In an embodiment, input signals coming to the base layer 380 from upper layers are assigned fixed logic values using a scan mode multiplexing method to increase fault coverage of the base layer 380.

Figure 9B:
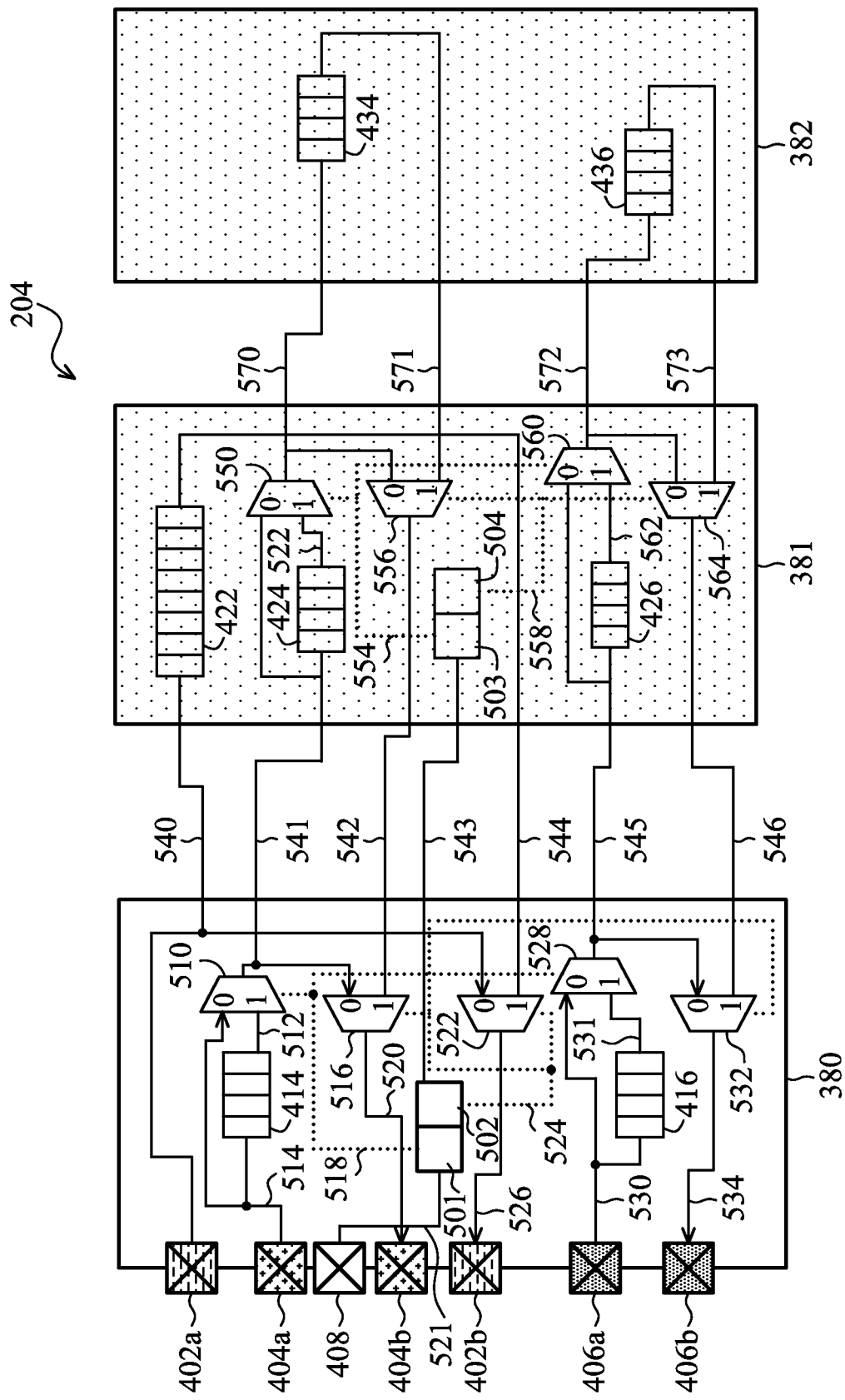

The KGL test pattern generation flow 216 (FIG. 8) proceeds to operation 814 where the scan flip-flops, 414 and 416, are bypassed. Referring to FIG. 9b, the test control elements 501 and 502 are set to a value "0" and a value "0" respectively. With this configuration, scan shift data goes from scan inputs, 402a, 404a and 406a, to respective scan outputs, 402b, 404b and 406b, without going through scan flip-flops, 414 and 416, at the base layer 380. The toolkit 800 is again executed to generate test patterns for detecting faults with the design 204 thus configured.

Figure 9C:
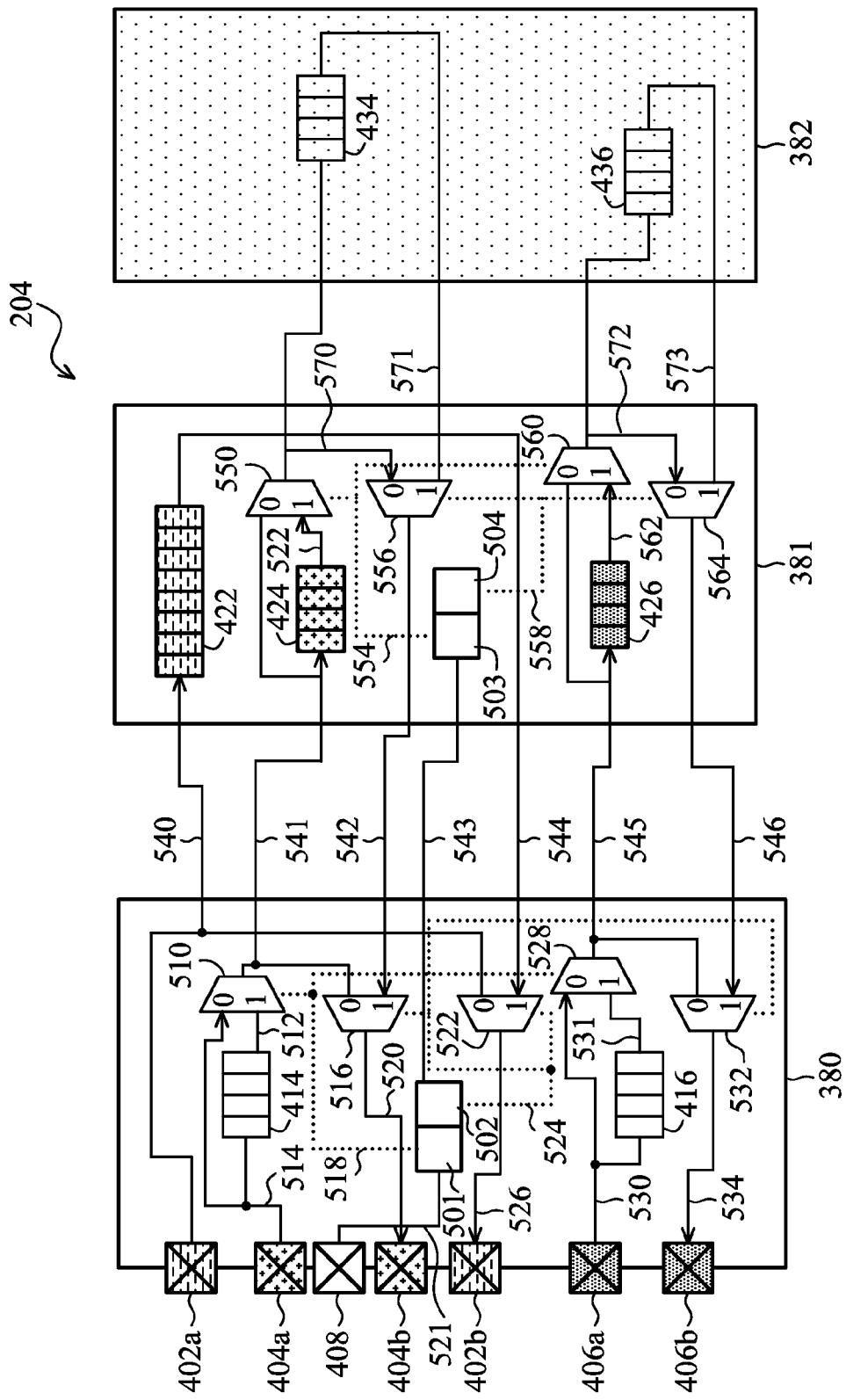

The KGL test pattern generation flow 216 (FIG. 8) proceeds to operation 816 to generate test patterns for the first upper layer 381. Referring to FIG. 9c, the test control elements, 501, 502, 503 and 504, are set to a value "0," a value "1," a value "1" and a value "0" respectively. With this configuration, scan shift data go through the base layer 380 and the first upper layer 381, bypassing scan flip-flops 414 and 416 at the base layer 380.

Referring again to FIG. 9c, a scan shift operation for the scan chain 402a/402b is as follows: data goes from scan input 402a to an input of scan flip-flops 422 via node 540, from an output of scan flip-flops 422 to an input of multiplexer 522 via node 544, then from an output of multiplexer 522 to scan output 402b via node 526.

Referring again to FIG. 9c, a scan shift operation for the scan chain 404a/404b is as follows: data goes from scan input 404a to an input of multiplexer 510 via node 514, from an output of multiplexer 510 to an input of flip-flops 424 via node 541, from an output of flip-flops 424 to an input of multiplexer 550 via node 552, from an output of multiplexer 550 to an input of multiplexer 556 via node 570, from an output of multiplexer 556 to an input of multiplexer 516 via node 542, then from an output of multiplexer 516 to scan output 404b via node 520.

Referring again to FIG. 9c, a scan shift operation for the scan chain 406a/406b is as follows: data goes from scan input 406a to an input of multiplexer 528 via node 530, from an output of multiplexer 528 to an input of scan flip-flops 426 via node 545, from an output of scan flip-flops 426 to an input of multiplexer 560 via node 562, from an output of multiplexer 560 to an input of multiplexer 564 via node 572, from an output of multiplexer 564 to an input of multiplexer 532 via node 546, then from an output of multiplexer 532 to scan output 406b via node 534.

At operation 816, the toolkit 800 is again executed to generate test patterns for detecting faults with the design 204 thus configured (FIG. 9c).

In an embodiment, operation 816 sets the test control elements, 501, 502, 503 and 504, to a value "1," a value "1," a value "1" and a value "0" respectively. With this configuration, scan shift data go through the base layer 380 and the first upper layer 381, including scan flip-flops 414 and 416 at the base layer 380.

The KGL test pattern generation flow 216 (FIG. 8) proceeds to operation 818. If there is no more upper layer for fault testing, the KGL test generation flow 216 terminates and stores test patterns thus far generated into a data file 822. If there are more upper layers for fault testing, as is the case for the layer 382 in the present embodiment, the KGL test pattern generation flow 216 proceeds to operation 820 to setup the layers that have been covered by the test patterns, such as the layers 380 and 381 in the present embodiment.

Figure 9D:
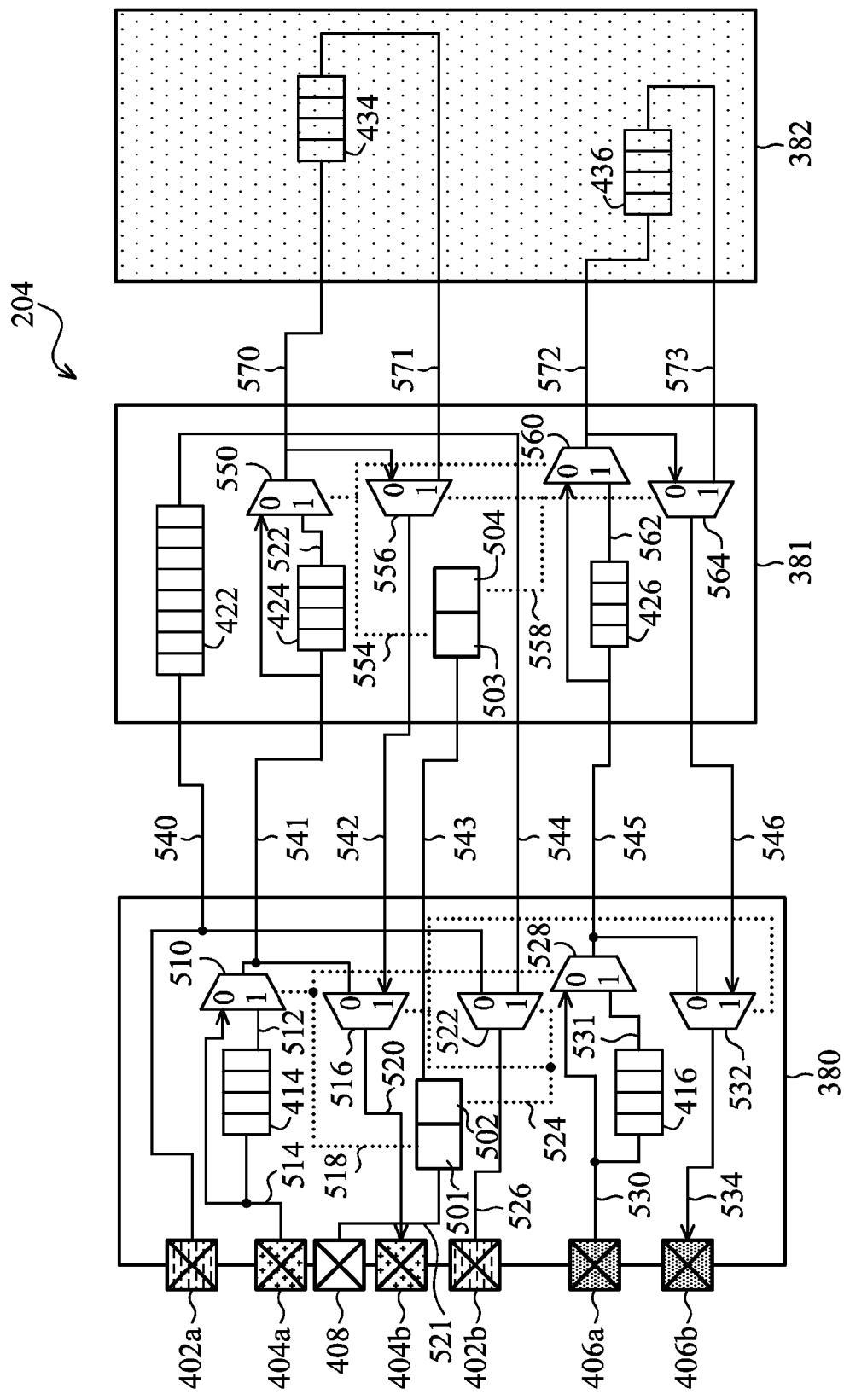

Referring to FIG. 9d, operation 820 sets the test control elements, 501, 502, 503 and 504, to a value "0," a value "1," a value "0" and a value "0" respectively. With this configuration, scan shift data go through the base layer 380 and the first upper layer 381, bypassing scan flip-flops 414 and 416 at the base layer 380 and bypassing scan flip-flops 424. In the present embodiment, since scan testing with the scan chain 402a/402b has been accomplished in previous operations, the scan chain 402a/402b does not participate in further operations. The toolkit 800 is again executed to generate test patterns for detecting faults with the design 204 thus configured (FIG. 9d).

Figure 9E:
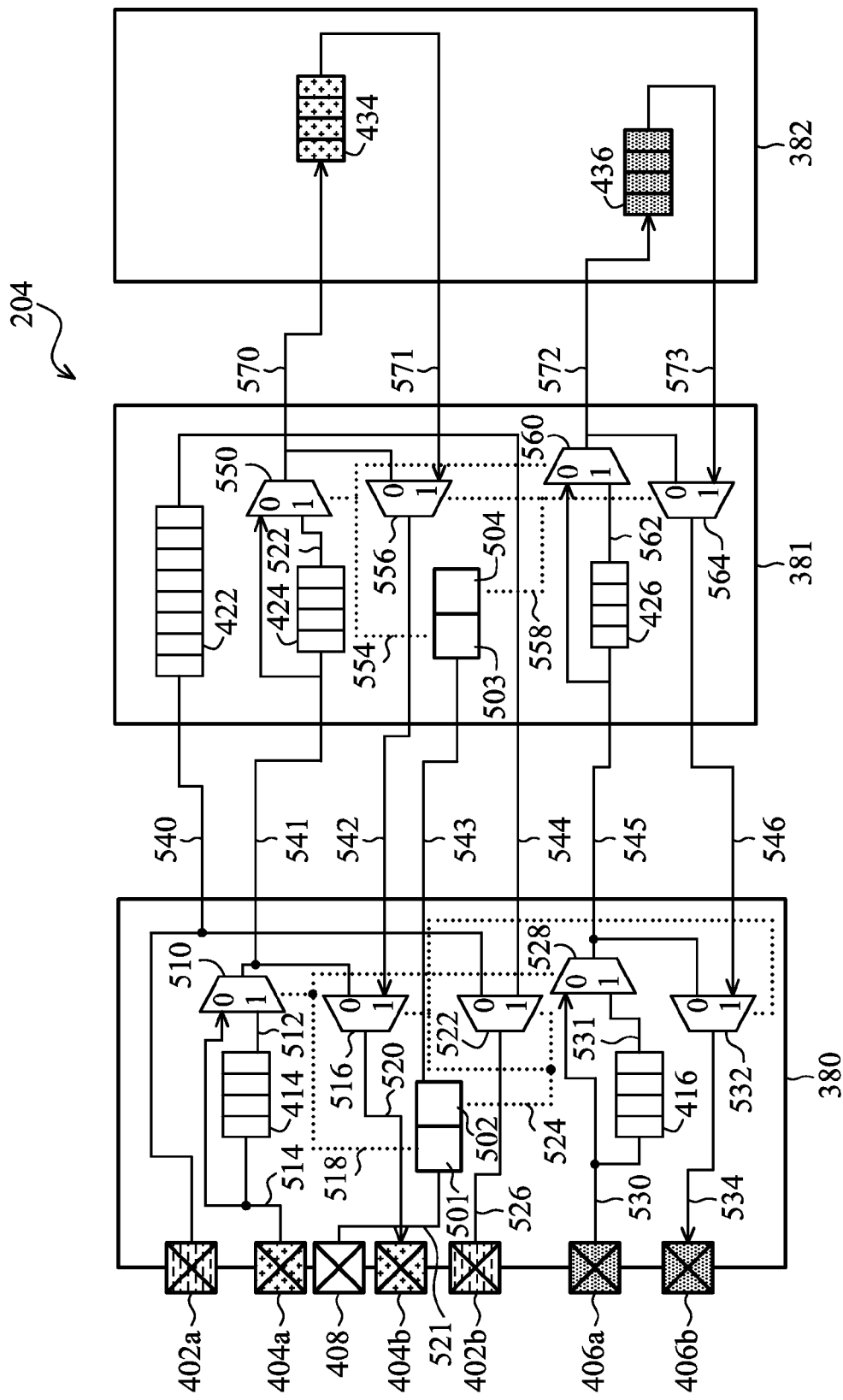

The KGL test pattern generation flow 216 (FIG. 8) proceeds from operation 820 to operation 816 to generate test patterns for the second upper layer 382. Referring to FIG. 9e, operation 816 sets the test control elements, 501, 502, 503 and 504, to a value "0," a value "1," a value "0" and a value "1" respectively. With this configuration, scan shift data go through the base layer 380 and the upper layers 381 and 382, bypassing scan flip-flops 414 and 416 at the base layer 380, bypassing scan flip-flops 424 and 426 at the first upper layer 381, but including scan flip-flops 434 and 436 at the second upper layer 382. In this configuration, the scan chain 402a/402b remains being ignored.

Referring again to FIG. 9e, a scan shift operation for the scan chain 404a/404b is as follows: data goes from scan input 404a to an input of multiplexer 510 via node 514, from an output of multiplexer 510 to an input of multiplexer 550 via node 541, from an output of multiplexer 550 to an input of scan flip-flops 434 via node 570, from an output of scan flip-flops 434 to an input of multiplexer 556 via node 571, from an output of multiplexer 556 to an input of multiplexer 516 via node 542, then from an output of multiplexer 516 to scan output 404b via node 520.

Referring again to FIG. 9e, a scan shift operation for the scan chain 406a/406b is as follows: data goes from scan input 406a to an input of multiplexer 528 via node 530, from an output of multiplexer 528 to an input of multiplexer 560 via node 545, from an output of multiplexer 560 to an input of multiplexer 564 via node 572, from an output of multiplexer 564 to an input of scan flip-flops 436 via node 572, from an output of scan flip-flops 436 to an input of multiplexer 564 via node 573, from an output of multiplexer 564 to an input of multiplexer 532 via node 546, then from an output of multiplexer 532 to scan output 406b via node 534.

At operation 816, the toolkit 800 is again executed to generate test patterns for detecting faults with the design 204 thus configured (FIG. 9e).

In an embodiment, operation 816 sets the test control elements, 501, 502, 503 and 504, to a value "1," a value "1," a value "1" and a value "1" respectively. With this configuration, scan shift data go through the base layer 380 and the upper layers 381 and 382, including scan flip-flops 414 and 416 at the base layer 380, including scan flip-flops 424 and 426 at the first upper layer 381, and including scan flip-flops 434 and 436 at the second upper layer 382.

Thus far illustrated is a layer-by-layer KGL test pattern generation flow for the monolithic stacked IC 114 at circuit design phase 106 (FIG. 1). In another embodiment, with appropriate test control settings, test patterns of concurrent testing of two or more layers in the monolithic stacked IC 114 can be generated. Furthermore, in another embodiment, test patterns for the entire monolithic stacked IC 114 may be generated. In yet another embodiment, other combinations of layers testing can be generated. When the monolithic stacked IC 114 is fabricated at phase 112, the test patterns are applied for detecting manufacture faults of the IC 114 as each layer is fabricated. This is illustrated in FIG. 10 in conjunction with FIGS. 11a-11i and FIGS. 12a-12i.

Figure 10:
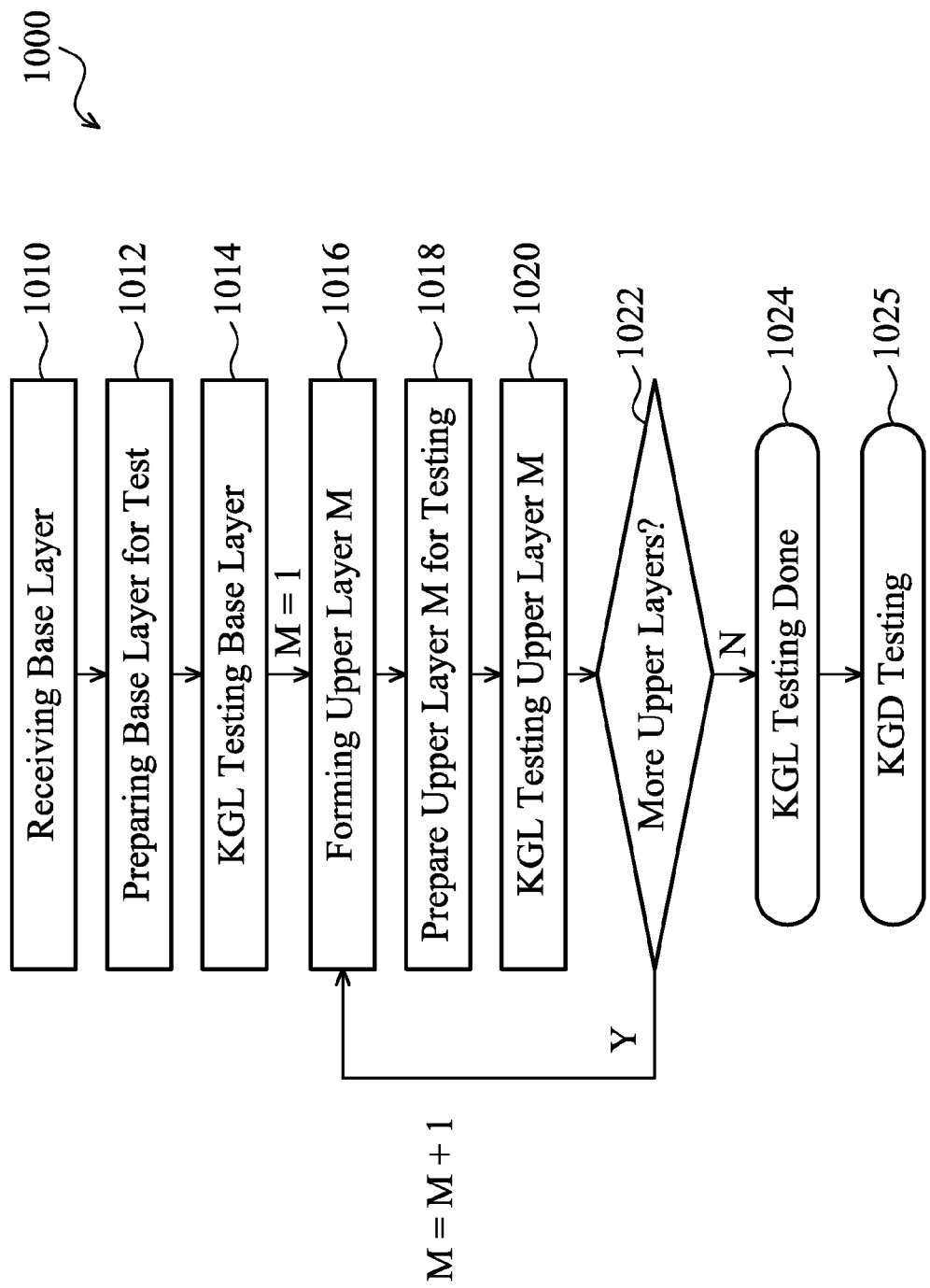
FIG. 10 illustrates a monolithic stacked IC manufacture fault testing flow according to various aspects of the present disclosure.

Referring to FIG. 10, an embodiment of a monolithic stacked IC manufacture fault testing application flow 1000 is shown. The testing flow 1000 begins with operation 1010 where a wafer including a base layer is received. FIG. 11a shows one exemplar base layer 1110 for the IC 114. The base layer 1110 includes a substrate 1102. The base layer is defined to have two surfaces 1105 and 1107. In the present embodiment, the surface 1105 is at an active region side of the base layer and the surface 1107 is at a metal side of the base layer. In an embodiment, the substrate 1102 is a silicon substrate. The base layer 1110 further includes a via 1104. In the present embodiment, the via 1104 is a through-silicon via (TSV).

Figure 11E:
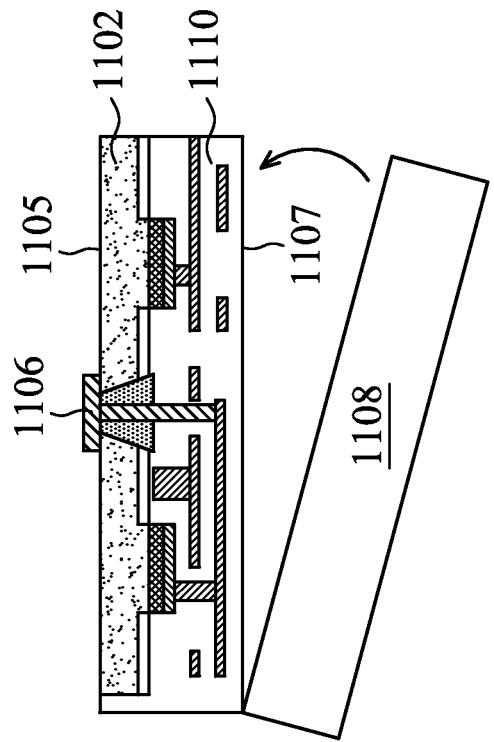
Figure 11D:
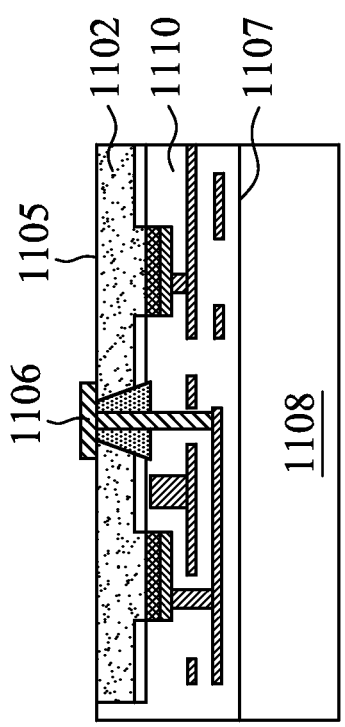

After receiving the base layer 1110, the testing flow 1000 (FIG. 10) proceeds to operation 1012 for preparing the base layer 1110 for fault testing. Referring to FIG. 11b, a probe pad 1106 is attached to the surface 1105 and electrically contacts the base layer 1110 through the via 1104. Other probe pads suitable for fault testing of the base layer 1110 are similarly attached. Next, as illustrated in FIG. 11c, the base layer 1110 is bonded to a carrier wafer 1108 with the surface 1107 facing the carrier wafer. The probe pads, such as the probe pad 1106, are exposed. Thus bonded, as shown in FIG. 11d, the base layer 1110 is ready for fault testing.

The testing flow 1000 (FIG. 10) proceeds to operation 1014 for applying test patterns to the base layer. The test patterns have been generated according to one or more embodiments of the KGL test pattern generation flow 216 as shown in FIG. 8 with scan configurations such as shown in FIGS. 9a and 9b. If defects are found with the base layer 1110, some dispositions may be taken. For example, the IC 114 may be marked as bad on a wafer map and discarded for further fabrication and processes. For example, the base layer 1110 may be repaired to fix the defects.

Figure 11G:
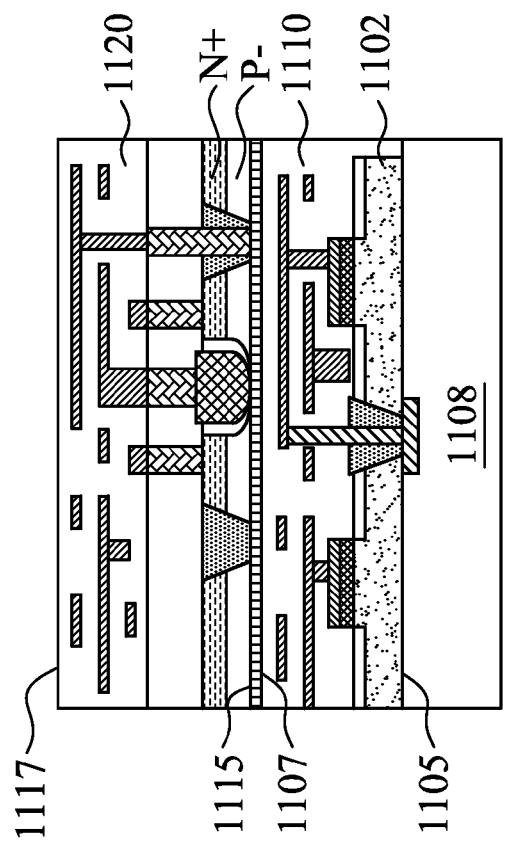
Figure 11F:
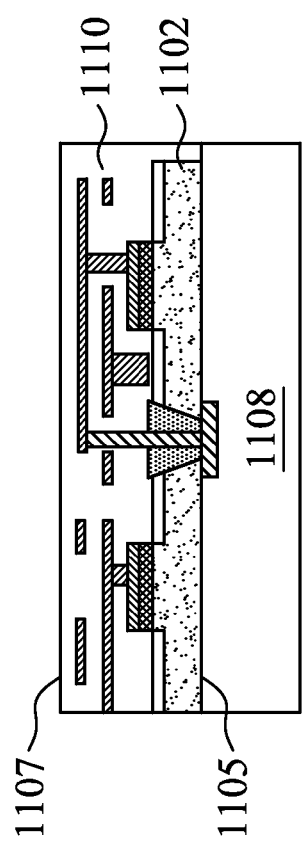

Once the base layer 1110 is found to be satisfactory for further IC fabrication, the testing flow 1000 (FIG. 10) proceeds to operation 1016 for forming an upper layer over the base layer. This is illustrated in FIGS. 11e-11g. FIG. 11e shows that the carrier wafer 1108 is detached from the base layer 1110. FIG. 11f shows that the base layer 1110 is bonded on the carrier wafer 1108 with the surface 1105 facing the carrier wafer 1108. FIG. 11g shows that an upper layer 1120 is formed over the surface 1107 and electrically contacts the base layer 1110. In the present embodiment, as shown in FIG. 11g, the upper layer 1120 has two surfaces 1115 (active region side) and 1117 (metal region side), with the surface 1115 directly over the surface 1107. Forming the upper layer 1120 may be done by a variety of processes. In an embodiment, a process of forming the upper layer 1120 starts with receiving a new wafer (a donor wafer), constructing dopant regions in a top layer of the new wafer and activating the dopant regions at a high temperature, such as about 1000 degree Celsius. The process then proceeds to implanting hydrogen into the dopant regions for cutting the dopant regions at a later step, bonding the new wafer to the base layer 1110 with the dopant regions directly over the base layer 1110 and performing an ion cut process to the new wafer thereby leaving a thin layer of dopant regions over the base layer 1110. The process then proceeds to forming shallow trench isolations (STI) in the thin layer of dopant regions for defining isolation regions for through-layer vias and for defining active regions for devices, such as recess channel array transistors (RCATs). In an embodiment, forming STI regions includes etching shallow trenches in the dopant regions, depositing a dielectric material layer, such as oxide, into the shallow trenches and over the dopant regions and performing a chemical-mechanical polishing (CMP) process to the dielectric material layer. The process of forming the upper layer 1120 then proceeds to etching gate regions within the active regions defined by the STI regions, forming gate oxide and forming gate electrode. The process further includes forming interconnect structures within the upper layer 1120 as well as between the upper layer 1120 and the base layer 1110. In an embodiment, a process of forming interconnect structures includes forming a dielectric material layer over the STI and active regions of the upper layer 1120, performing a CMP process to the dielectric material layer, etching the dielectric material layer and/or the STI regions to form through-layer vias and/or RCAT contact trenches, depositing conducting materials, such as copper, into the vias and/or trenches and performing another CMP process to the conducting materials.

Figure 11I:
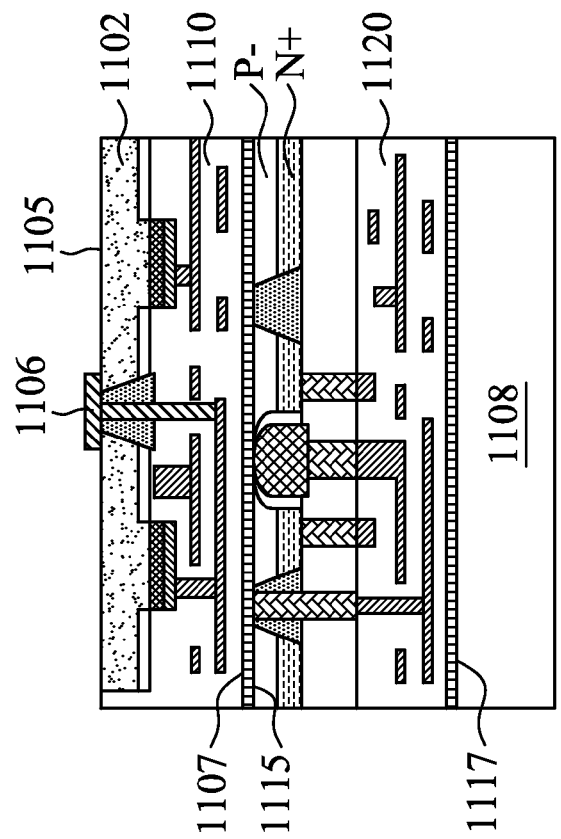
Figure 11H:
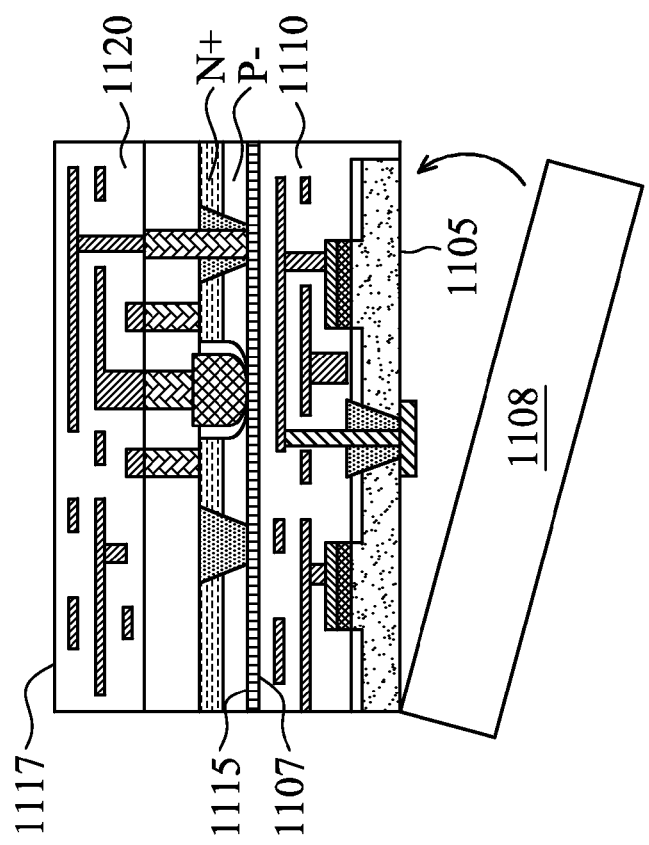

With the upper layer 1120 thus formed directly over the base layer 1110, The testing flow 1000 (FIG. 10) proceeds to operation 1018 for preparing the base layer 1110 and the upper layer 1120 for fault testing. This is illustrated in FIGS. 11h and 11i. FIG. 11h shows that the carrier wafer 1108 is detached from the base layer 1110. FIG. 11i shows that the upper layer 1120 is bonded onto the carrier wafer 1108 with the surface 1117 facing the carrier wafer 1108. With such bonding, the probe pads attached to the surface 1105, such as the probe pad 1106, are exposed for applying tests to the base layer 1110 and the upper layer 1120.

The testing flow 1000 (FIG. 10) proceeds to operation 1020 for applying test patterns to the base layer 1110 and the upper layer 1120. The test patterns have been generated according to one or more embodiments of the KGL test pattern generation flow 216 as shown in FIG. 8 with scan configurations such as shown in FIGS. 9c and 9d. If defects are found with the layers, some dispositions may be taken. For example, the IC 114 may be marked as bad and discarded for further fabrication and processes. For example, the upper layer 1120 may be repaired to fix the defects.

The testing flow 1000 (FIG. 10) proceeds to operation 1022. If there is no more upper layer to fabricate, the known-good-layer(s) testing finishes at operation 1024 and further testing to the completed stacked IC 114 may be performed in operation 1025. For example, a known-good-die (KGD) testing of the IC 114 may be performed to gain higher test coverage as all layers and all connections of the IC 114 are now complete. For example, the IC 114 may be cut out of the wafer, packaged, and tested again with the package.

If there are more upper layers to be fabricated and tested, the testing flow 1000 (FIG. 10) goes back to operation 1016 and the aforementioned process of forming and testing an upper layer of the IC 114 is repeated.

FIGS. 12a-12i illustrate another embodiment of the testing flow 1000 (FIG. 10) according to various aspects of the present disclosure. For simplicity purposes, only brief descriptions of the drawing are made with specific features highlighted.

Figure 12A:
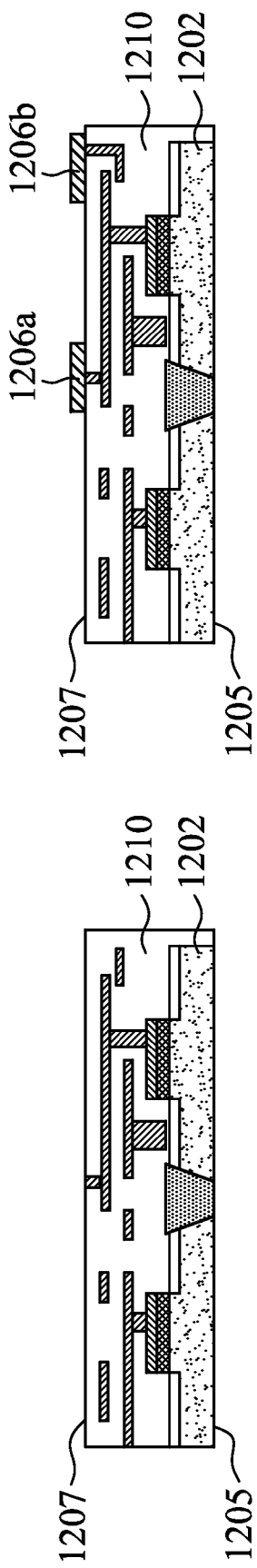
FIGS. 12a-12i shows another embodiment of monolithic stacked IC manufacture fault test application flow according to various aspects of the present disclosure.
Figure 12B:
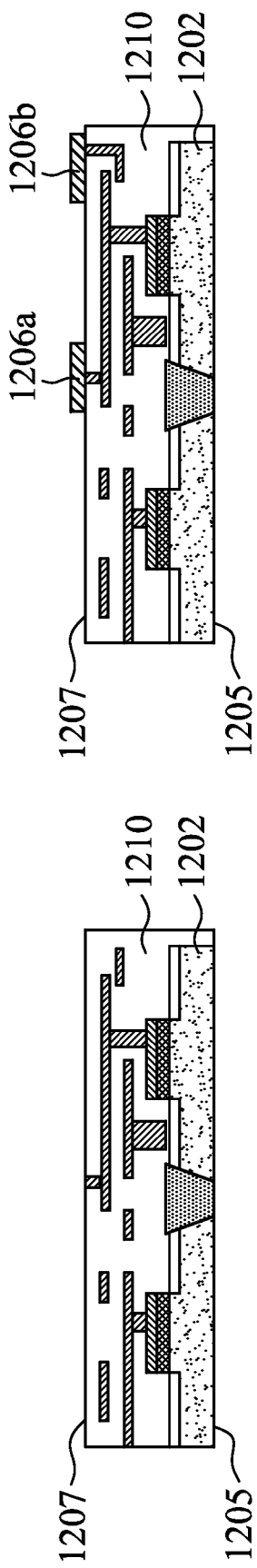

FIG. 12a shows an exemplar base layer 1210 of the IC 114 with a substrate 1202 and two surfaces 1205 (active region side) and 1207 (metal side). FIG. 12b shows that probe pads 1206a and 1206b are attached to the surface 1207 and electrically contact the base layer 1210. Test patterns for the base layer 1210 are applied for testing the base layer 1210 pursuant to operation 1014 (FIG. 10).

Figure 12C:
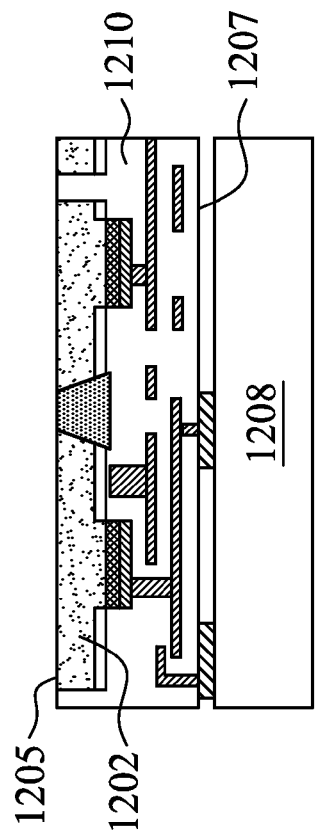

FIG. 12c shows that the base layer 1210 is bonded to a carrier wafer 1208 with the surface 1207 facing the carrier wafer 1208. In an embodiment, the probe pads 1206a and 1206b are removed (or detached) from the base layer 1210 before the base layer 1210 is bonded to the carrier wafer 1208.

Figures 12D, 12E:
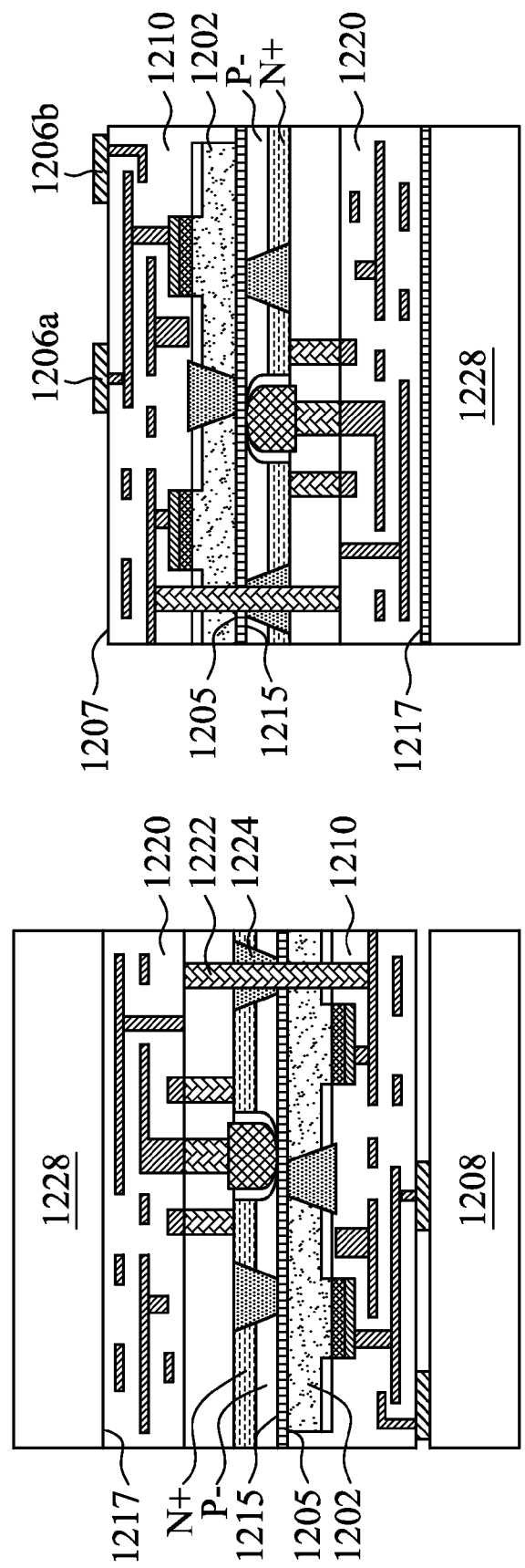

In another embodiment, the probe pads 1206a and 1206b remain on the surface 1207 when the base layer 1210 is bonded to the carrier wafer 1208. FIG. 12d shows that a first upper layer 1220 is formed over the base layer 1210. The first upper layer 1220 has two surfaces, 1215 (active region side) and 1217 (metal side) with the surface 1215 directly over the base layer 1210. FIG. 12d also shows that the surface 1217 is bonded to a carrier wafer 1228 for proper handling. The first upper layer 1220 electrically contacts the base layer 1210 with a conducting feature 1222 and a through-layer via 1224. FIG. 12e shows that the carrier wafer 1208 is detached from the base layer 1210. In an embodiment, if the probe pads 1206a and 1206b have been removed (or detached) at an earlier operation, they are re-attached to the surface 1207. With the base layer 1210, the first upper layer 1220 and the carrier wafer 1228 are bonded, as shown in FIG. 12e, test patterns for the layers, 1210 and 1220, are applied for testing the IC 114 pursuant to operation 1020 (FIG. 10).

Figure 12G:
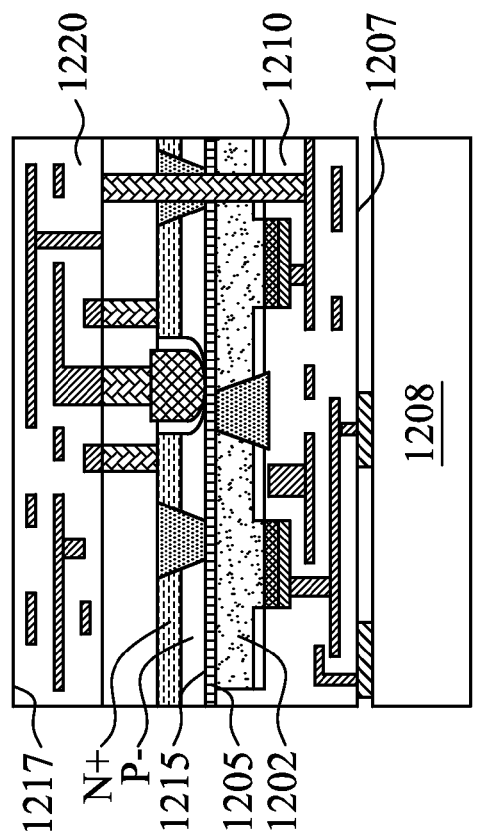
Figure 12F:
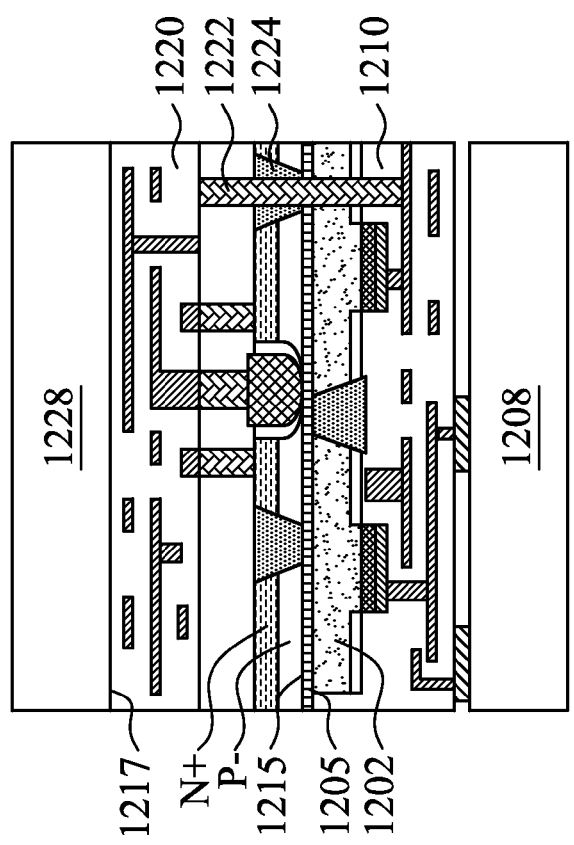

FIG. 12f shows that the base layer 1210 is bonded to the carrier wafer 1208 with the surface 1207 facing the carrier wafer 1208. FIG. 12g shows that the carrier wafer 1228 is detached from the first upper layer 1220 with the surface 1217 exposed for forming another upper layer directly over the first upper layer 1220.

Figures 12H, 12I:
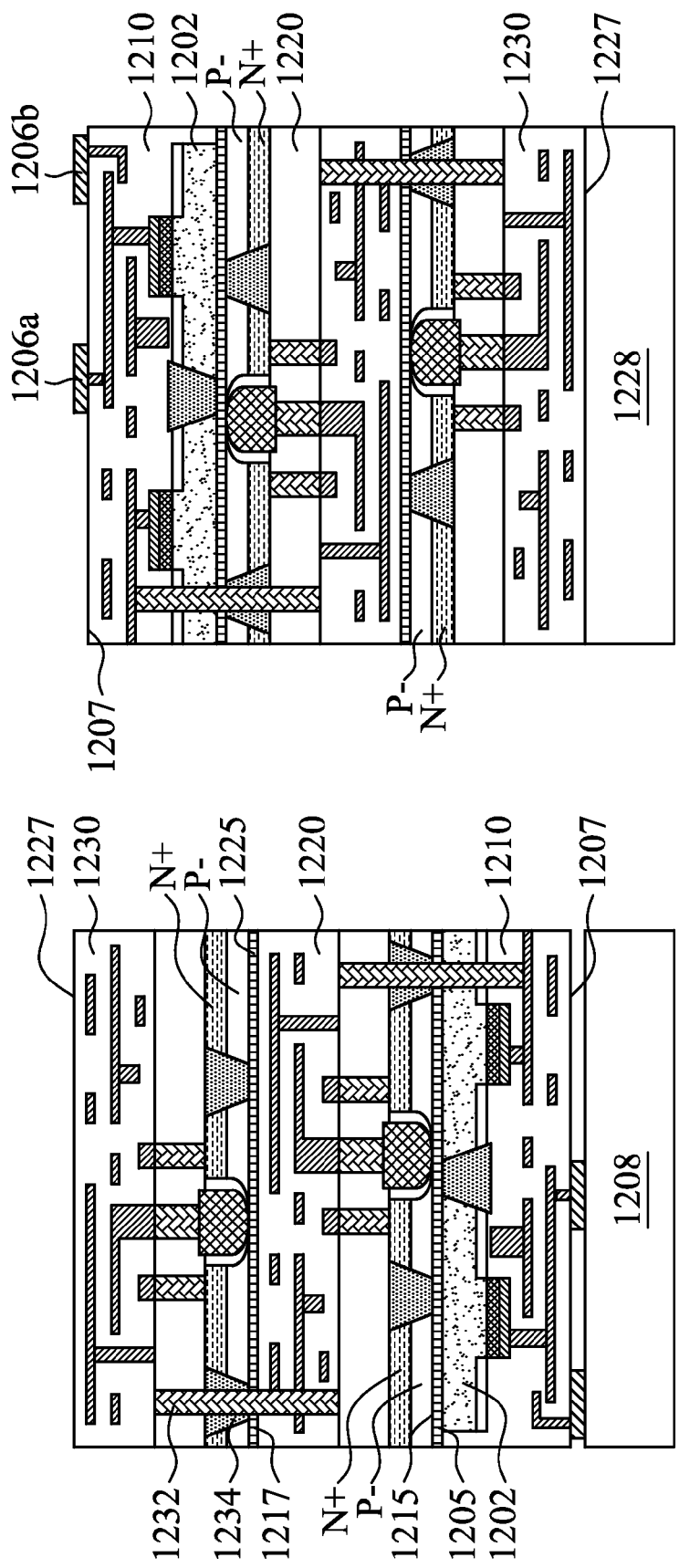

FIG. 12h shows that a second upper layer 1230 is formed on the upper layer 1220. The second upper layer 1230 has two surfaces, 1225 (active region side) and 1227 (metal side), with the surface 1225 facing the first upper layer 1220. The second upper layer 1230 electrically contacts the first upper layer 1220 with a conducting feature 1232 and a through-layer via 1234. FIG. 12i shows that the carrier wafer 1228 is bonded to the second upper layer 1230 and the carrier wafer 1208 is detached from the base layer 1210. In an embodiment, if the probe pads 1206a and 1206b have been removed (or detached) at an earlier operation, they are re-attached to the surface 1207. With the base layer 1210, the first upper layer 1220, the second upper layer 1230 and the carrier wafer 1228 are bonded, as shown in FIG. 12i, test patterns for the layers, 1210, 1220 and 1230, are applied for testing the IC 114 pursuant to operation 1020 (FIG. 10).

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

In one exemplary aspect, the present disclosure is directed to a monolithic stacked integrated circuit (IC) known-good-layer (KGL) test circuit in a first layer of the IC wherein the IC includes the first layer and a second layer and the first layer includes a scan segment. The test circuit includes a first test input, coupled to an input of the scan segment, to receive a first scan shift data. The test circuit further includes a first multiplexer. The first multiplexer has two data inputs, a selection input, and a data output wherein one data input of the first multiplexer is coupled to the first test input and another data input of the first multiplexer is coupled to an output of the scan segment. The test circuit further includes a first test output, coupled to the data output of the first multiplexer, to send a second scan shift data to the second layer. The test circuit further includes a second test input, to receive a third scan shift data from the second layer. The test circuit further includes a second multiplexer. The second multiplexer has two data inputs, a selection input, and a data output wherein one data input of the second multiplexer is coupled to the second test input and another data input of the second multiplexer is coupled to the data output of the first multiplexer. The test circuit further includes a second test output, coupled to the data output of the second multiplexer, to send a fourth scan shift data. The test circuit further includes a first control element, coupled to the selection input of the first multiplexer. The test circuit further includes a second control element, coupled to the selection input of the second multiplexer.

In another exemplary aspect, the present disclosure is directed to a monolithic stacked integrated circuit (IC) known-good-layer (KGL) test pattern generation method. The method includes receiving a circuit design of the IC, wherein the circuit design includes a first layer, a second layer and a scan chain. The scan chain includes a scan input, a scan output, a first scan segment in the first layer and a second scan segment in the second layer. The first layer includes a first test input, coupled to an input of the first scan segment. The first layer further includes a first multiplexer. The first multiplexer has a first data input, a second data input, a first selection input and a first data output wherein the first data input is coupled to the first test input and the second data input is coupled to an output of the first scan segment. The first layer further includes a first test output, coupled to the first data output. The first layer further includes a second test input and a second multiplexer. The second multiplexer has a third data input, a fourth data input, a second selection input and a second data output wherein the third data input is coupled to the second test input and the fourth data input is coupled to the first data output. The first layer further includes a second test output, coupled to the second data output. The second layer includes a third test input coupled to an input of the second scan segment, a third test output and a means for coupling the third test output to an output of the second scan segment. The circuit design further includes a means for coupling the scan input to the first test input, a means for coupling the first test output to the third test input, a means for coupling the third test output to the second test input and a means for coupling the second test output to the scan output. The method further includes configuring the first selection input thereby passing the second data input to the first data output. The method further includes configuring the second selection input thereby passing the fourth data input to the second data output. The method further includes generating test patterns for detecting faults at the first layer.

In another exemplary aspect, the present disclosure is directed to a monolithic stacked integrated circuit (IC) manufacture fault testing method. The testing method includes receiving a base layer of the IC, wherein the base layer includes a substrate, the base layer has a first surface and a second surface, a plurality of probe pads are attached to the first surface and the probe pads electrically contact the base layer. The testing method further includes applying a first fault testing through the probe pads and bonding the first surface to a first carrier wafer. The testing method further includes forming an upper layer of the IC over the base layer, wherein the upper layer has a third surface and a fourth surface, the third surface is over the second surface and the upper layer electrically contacts the base layer through the third surface and the second surface. The testing method further includes detaching the first surface from the first carrier wafer and applying a second fault testing through the probe pads.

What is claimed is:

1. A monolithic stacked integrated circuit (IC) comprising a known-good-layer (KGL) test circuit having a scan segment in a first layer of the IC, the KGL test circuit comprising:
    a first test input, coupled to an input of the scan segment, to receive a first scan shift data;
    a first multiplexer, the first multiplexer having two data inputs, a selection input, and a data output, wherein one data input of the first multiplexer is coupled to the first test input and another data input of the first multiplexer is coupled to an output of the scan segment;
    a first test output, coupled to the data output of the first multiplexer, to send the first scan shift data to a second layer;
    a second test input, to receive a second scan shift data from the second layer;
    a second multiplexer, the second multiplexer having two data inputs, a selection input, and a data output, wherein one data input of the second multiplexer is coupled to the second test input and another data input of the second multiplexer is coupled to the data output of the first multiplexer;
    a second test output, coupled to the data output of the second multiplexer;
    a first control element, coupled to the selection input of the first multiplexer; and
    a second control element, coupled to the selection input of the second multiplexer.

2. The IC of claim 1, wherein:
    the first control element is: an input to the first layer or a programmable register in the first layer; and
    the second control element is: another input to the first layer or another programmable register in the first layer.

3. The IC of claim 1, wherein the first and second control elements are registers programmed using one of:
    a second scan chain, the second scan chain having the first and second control elements;
    an IEEE 1149.1 interface; and
    an IEEE 1500 interface.

4. The IC of claim 1, wherein:
    the first layer is a base layer of the IC; and
    the first test input and the second test output are IO pads of the IC.

5. The IC of claim 1, wherein:
    the first layer and the second layer are upper layers of the IC;
    IO pads of the IC are located on a base layer of the IC; and
    the IC has means for coupling the first test input and the second test output to the IO pads.

6. The IC of claim 1, wherein the scan segment includes no scan flip-flops and the first multiplexer is degenerated.

7. The IC of claim 1, wherein the scan segment is register-based.

8. A method for generating a monolithic stacked integrated circuit (IC) known-good-layer (KGL) test pattern, the method comprising:
    receiving a circuit design of the IC, wherein:
        the circuit design includes a first layer, a second layer, and a scan chain;
        the scan chain includes a scan input, a scan output, a first scan segment in
        the first layer, and a second scan segment in the second layer;
        the first layer includes:
            a first test input, coupled to an input of the first scan segment;

a first multiplexer, the first multiplexer having a first
data input, a
second data input, a first selection input and a first data
output, wherein the first data input is coupled to the first test
input and the second data input is coupled to an output of
the first scan segment;
a first test output, coupled to the first data output;
a second test input;
a second multiplexer, the second multiplexer having a
third data
input, a fourth data input, a second selection input,
and a
second data output, wherein the third data input is
coupled to
the second test input and the fourth data input is coupled
to the first data output; and
a second test output, coupled to the second data output;
the second layer includes a third test input coupled to an
input of the
second scan segment, a third test output, and a means for
coupling the third test output to an output of the second scan segment; and
the circuit design further includes a means for coupling
the scan input to
the first test input, a means for coupling the first test
output to the third test input, a means for coupling the
third test output to the second test input and a means
for coupling the second test output to the scan output;
configuring the first selection input thereby passing the
second data input to the first data output;
configuring the second selection input thereby passing the
fourth data input to the second data output; and
generating test patterns for detecting faults at the first layer.

9. The method of claim 8, further comprising:
configuring the second selection input thereby passing the
third data input to the second data output; and
generating test patterns for detecting faults at the second
layer.

10. The method of claim 9, further comprising, before the
generating test patterns for detecting faults at the second
layer:
configuring the first selection input thereby passing the first
data input to the first data output.

11. The method of claim 8, wherein the configuring the first
and the second selection inputs uses one of:
inputs at the first layer;
a second scan chain, the second scan chain having a plurality of scan flip-flops at the first layer;
an IEEE 1149.1 interface at the first layer; and
an IEEE 1500 interface at the first layer.

12. The method of claim 8, wherein the first scan segment
includes no scan flip-flops and the first multiplexer is degenerated.

13. The method of claim 8, wherein:
the first layer and the second layer are two adjacent layers
of the IC; and
the first layer is one of: a base layer of the IC or an upper
layer of the IC.

14. A monolithic stacked integrated circuit (IC) known-good-layer (KGL) fault testing method, comprising:
receiving a base layer of the IC, wherein the base layer
includes a substrate, the base layer has a first surface and
a second surface, a plurality of probe pads are attached to
the first surface and the probe pads electrically contact
the base layer;
applying a first fault testing to the base layer of the IC
through the probe pads;
bonding the first surface to a first carrier wafer;
forming an upper layer of the IC over the base layer,
wherein the upper layer has a third surface and a fourth
surface, the third surface is over the second surface and
the upper layer electrically contacts the base layer
through the third surface and the second surface;
after the forming of the upper layer, detaching the first
surface from the first carrier wafer; and
after the detaching of the first surface, applying a second
fault testing to the base layer and the upper layer of the
IC through the probe pads.

15. The IC testing method in claim 14, further comprising,
bonding the fourth surface to a second carrier wafer before
applying the second fault testing.

16. The IC testing method in claim 14, further comprising:
detaching the probe pads before the bonding the first surface to the first carrier wafer; and
attaching the probe pads to the first surface before applying
the second fault testing through the probe pads.

17. The IC testing method in claim 14, wherein the substrate includes silicon.

18. The IC testing method in claim 14, wherein the first
surface is a surface of the substrate.

19. The IC testing method in claim 14, wherein the probe
pads electrically contact the base layer using one of:
through-silicon vias;
through-layer vias; and
conducting features on the first surface.

20. The IC testing method in claim 14, wherein:
the IC includes KGL test circuits in at least the base layer;
and
the first and the second fault testing use KGL test patterns.

* * * * *